United States Patent
Lin et al.

(10) Patent No.: US 11,676,841 B2
(45) Date of Patent: Jun. 13, 2023

(54) OVERHEAD HOIST TRANSPORT DEVICE AND METHOD OF USING THE SAME

(71) Applicant: Taiwan Semiconductor Manufacturing Company Limited, Hsinchu (TW)

(72) Inventors: Chuan Wei Lin, Hsinchu (TW); Fu-Hsien Li, Taichung (TW); Chi-Feng Tung, Jhunan Township (TW); Hsiang Yin Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/232,338

(22) Filed: Apr. 16, 2021

(65) Prior Publication Data

US 2022/0336244 A1    Oct. 20, 2022

(51) Int. Cl.
*H01L 21/677* (2006.01)

(52) U.S. Cl.
CPC .. *H01L 21/67724* (2013.01); *H01L 21/67706* (2013.01); *H01L 21/67733* (2013.01)

(58) Field of Classification Search
CPC ......... H01L 21/67724; H01L 21/67706; H01L 21/67733; H01L 21/6773; H01L 21/67769; H01L 21/67736; B65G 1/16
See application file for complete search history.

(56) References Cited

U.S. PATENT DOCUMENTS

| | | | | |
|---|---|---|---|---|
| 5,570,990 A | * | 11/1996 | Bonora | G03F 7/70741 414/940 |
| 6,019,563 A | * | 2/2000 | Murata | B23Q 7/1436 414/940 |
| 6,169,935 B1 | * | 1/2001 | Iwasaki | H01L 21/67276 700/214 |
| 6,454,512 B1 | * | 9/2002 | Weiss | H01L 21/67775 414/217 |
| 6,551,049 B2 | * | 4/2003 | Gravell | B23Q 7/1442 414/940 |
| 9,190,304 B2 | * | 11/2015 | MacKnight | H01L 21/67736 |
| 2008/0015723 A1 | | 1/2008 | Chen et al. | |
| 2015/0203333 A1 | * | 7/2015 | Ota | H01L 21/6773 212/276 |

(Continued)

*Primary Examiner* — Glenn F Myers
(74) *Attorney, Agent, or Firm* — Harrity & Harrity, LLP

(57) ABSTRACT

Some implementations described herein provide a method that includes loading, from a load port and into a first buffer of a multiple-buffer overhead hoist transport (OHT) vehicle, a first transport carrier storing one or more processed wafers. The method includes unloading to the load port, while the first buffer retains the first transport carrier, and from a second buffer of the multiple-buffer OHT vehicle, a second transport carrier storing one or more wafers for processing. In other implementations, the method includes loading, into a first buffer of the multiple-buffer OHT vehicle, a first transport carrier storing one or more wafers for processing, while a semiconductor processing tool, associated with a load port, is processing one or more wafers associated with a second transport carrier. The method includes positioning the multiple-buffer OHT vehicle above the load port while the multiple-buffer OHT vehicle retains the first transport carrier in the first buffer.

20 Claims, 12 Drawing Sheets

(56) References Cited

U.S. PATENT DOCUMENTS

2015/0235883 A1* 8/2015 Hsieh ................ H01L 21/67379
 414/800
2021/0213983 A1* 7/2021 Yamazaki ............. B61L 23/041

* cited by examiner

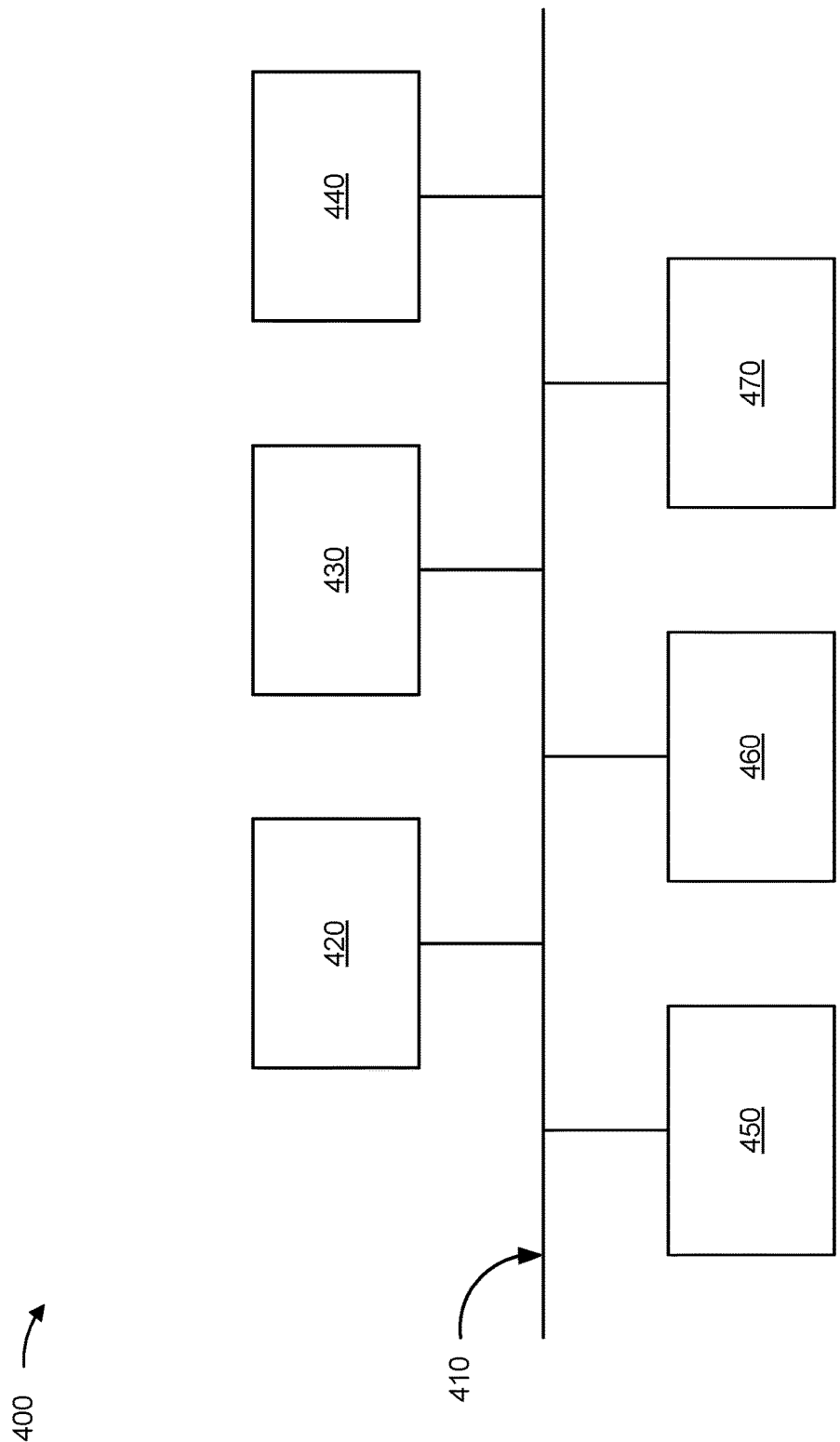

OVERHEAD HOIST TRANSPORT DEVICE AND METHOD OF USING THE SAME

BACKGROUND

Generally, an overhead hoist transport (OHT) system may move transport carriers that store wafers (such as front opening unified pods (FOUPs) for 300 millimeter (mm) wafers or standard mechanical interfaces (SMIFs) for 200 mm wafers) from a storage area to a semiconductor processing tool. A controller of an automated material handling system (AMHS) may send commands to OHT vehicles, which automates the transport and tracking of wafers within the fab. By moving wafers on overhead tracks, the OHT system may conserve floor area of the fab that would otherwise be reserved for transportation of wafers. This floor area may be used for additional storage area and/or additional semiconductor processing tools. As a result, OHT systems allow for more efficient use of floor space in fabs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram of example components of one or more devices of FIG. 1.

DETAILED DESCRIPTION

Figure 1:
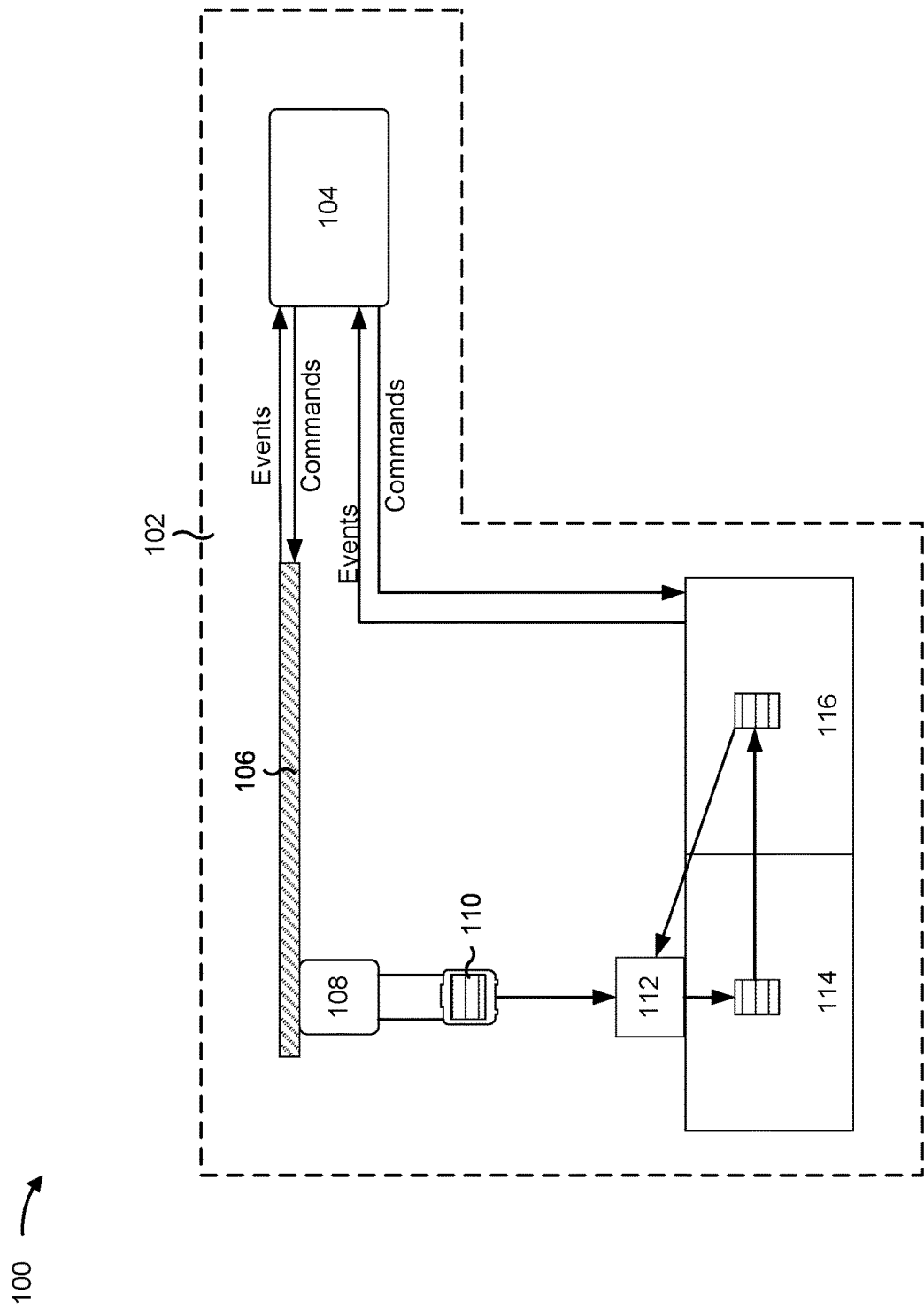
FIG. 1 is a diagram of an example microchip fabrication facility with an overhead hoist transport (OHT) system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During microchip fabrication, wafers (such as silicon wafers) are transported from a storage area (e.g., a storage rack) to a load port of a semiconductor processing tool that performs etching, deposition, or another fabrication technique. Accordingly, an automated material handling system (AMHS) may use an overhead hoist transport (OHT) system to perform transfer of the wafers from the storage area to the load port. For example, an OHT vehicle may transfer a transport carrier, such as a standard mechanical interface (SMIF) (e.g., for 200 mm wafers) or a front opening unified pod (FOUP) (e.g., for 300 mm wafers), that includes multiple wafers for processing. Additionally, the OHT vehicle may transfer a transport carrier that includes processed wafers from the load port back to the storage area, to a staging area for temporary holding, or to a load port of another semiconductor processing tool that will further process those wafers.

Generally, an OHT system may consume at least 60 seconds to transfer a completed transport carrier from the load port of a semiconductor processing tool back to the storage area and then consume at least an additional 120 seconds to transfer a new transport carrier filled with wafers from the storage area to the load port. However, this results in significant idle time for the load port. For example, during a particular lithography process, the semiconductor processing tool may, on average, wait approximately 6-10 minutes after processing one batch of wafers before receiving a full transport carrier with another batch of wafers to process. In addition, wafer processing operations are often time sensitive. For example, during another lithography process, a wafer may become unusable approximately 18 minutes after a wet etching operation if the wafer does not undergo an $N_2$ treatment operation, such that wet etched wafers are discarded due to excessive oxidation if not $N_2$ treated within approximately 18 minutes after etching. In another example, during another lithography process, a wafer may become unusable approximately 30 minutes after a dry etching operation if the wafer does not undergo a plasma ashing operation, such that dry etched wafers are discarded due to hardening and cross-linking of a photoresist if not plasma ashed within approximately 30 after etching. Accordingly, wafers that are not processed in time are wasted. Often, transfer time on an OHT vehicle is a significant factor in delaying processing operations, which may cause wafers to become unusable.

Some implementations described herein provide a multiple-buffer OHT vehicle for use in an OHT system. The multiple-buffer OHT vehicle may include a single inner volume that includes a plurality of buffers and is configured to support, store, and transport a plurality of transport carriers. Alternatively, the multiple-buffer OHT vehicle may include a plurality of inner volumes that are coupled together to operate as a plurality of buffers in unison. In some implementations, a multiple-buffer OHT vehicle that is configured to support, store, and transport a plurality of transport carriers may include a plurality of transfer devices, where each transfer device is configured to obtain, raise, lower, and/or provide a transport carrier. As an alternative, a multiple-buffer OHT vehicle that is configured to support, store, and transport a plurality of transport carriers may include a single transfer device that is configured to transfer a transport carrier between a storage position in the buffer and an active position (in which the single transfer device may obtain, raise, lower, and/or provide the transport carrier).

The multiple-buffer OHT vehicle may be configured to operate in various operating modes, including an air storage mode, a pre-transfer mode, and/or an exchange transfer mode. The air storage mode may include an operation mode in which the multiple-buffer OHT vehicle stores one or more transport carriers in the buffers of the multiple-buffer OHT vehicle so that additional transport carriers may be stored in a storage area or placed on a staging area in place of the one or more transport carriers. The pre-transfer mode may include an operation mode in which the multiple-buffer OHT vehicle transports the one or more transport carriers to above a load port or to an area near the load port (such as a staging area) in preparation for unloading the one or more transport carriers onto the load port. The exchange transfer mode includes an operation mode in which the multiple-buffer OHT vehicle obtains a first transport carrier from a load port while a second transport carrier is loaded in the multiple-buffer OHT vehicle, stores the first transport carrier in the multiple-buffer OHT vehicle, transfers the second transport carrier to the load port after or while the first transport carrier is loaded into the multiple-buffer OHT vehicle, and transfers the first transport carrier to another location.

By using a multiple-buffer OHT vehicle to exchange transport carriers, such as SMIFs or FOUPs, an AMHS may reduce the average time for removing a completed transport carrier from a semiconductor processing tool and providing a new transport carrier to the semiconductor processing tool. For example, the AMHS may reduce the average time for this process from approximately 180 seconds to approximately 40 seconds. This conserves power and increases the efficiency with which microchips may be fabricated. Additionally, the AMHS is less likely to experience transfer delays during fabrication processes, which reduces the chance that wafers will be rendered unusable and thus wasted. In some implementations, the AMHS can further reduce the average time for removing a completed transport carrier and providing a new transport carrier by pre-transferring the new transport carrier before the semiconductor processing tool submits a move out request (MOR) for the completed transport carrier. In some implementations, the AMHS may also use additional buffers provided by the multiple-buffer OHT to increase storage capacity. For example, the AMHS may process about 10% larger volume of transport carriers by storing some transport carriers on the multiple-buffer OHT during fabrication processes.

FIG. 1 is a diagram of an example fabrication facility 100 described herein. In particular, FIG. 1 illustrates control flow for transport carrier delivery in the fabrication facility 100. The fabrication facility 100 may process wafers, such as silicon wafers, using a plurality of semiconductor processing tools, such as an etching tool, a treatment tool, a deposition tool, a planarization tool, an ion implantation tool, and/or a tool that performs another type of fabrication technique.

As shown in FIG. 1, the fabrication facility 100 may include an AMHS 102. The AMHS 102 may include a controller 104. The controller 104 may track locations of wafers within the fabrication facility 100 and send commands to other components of the AMHS 102, as described in greater detail below.

As further shown in FIG. 1, the AMHS 102 may include an overhead track 106 that is configured to allow one or more OHT vehicles, such as OHT vehicle 108, to move within the fabrication facility 100 along the overhead track 106. The overhead track 106 may include a guided rail and/or another type of track configured to allow guides, wheels, and/or rollers of the OHT vehicle 108 to move along the overhead track 106.

The OHT vehicle 108 may further include a belt system, a pulley system, a hydraulic lift, and/or another type of lifting mechanism configured to selectively load (for example, by raising) a transport carrier 110 into a buffer of the OHT vehicle 108 and unload (for example, by lowering) the transport carrier 110 from the buffer of the OHT vehicle 108. The buffer of the OHT vehicle 108 may include an inner volume of the OHT vehicle 108 configured to receive and store the transport carrier 110 both when the OHT vehicle is stationary and when the OHT vehicle 108 is moving along the overhead track 106. The transport carrier 110 may be an SMIF, a FOUP, a cassette holder, a box, and/or another type of storage device configured to store one or more wafers.

To obtain the transport carrier 110, the OHT vehicle 108 may load the transport carrier 110 from a storage area. The controller 104 may transmit a command to the OHT vehicle 108 to move to the storage area and a command to the OHT vehicle 108 to load the transport carrier 110. The controller 104 may further receive signals (for example, event signals as shown in FIG. 1) from the OHT vehicle 108 when the transport carrier 110 is loaded such that the controller 104 may track one or more wafers stored in the transport carrier 110.

As further shown in FIG. 1, the OHT vehicle 108 may move to a load port 112 (for example, at a different part of the fabrication facility 100). The load port 112 may be associated with an inner buffer 114 for a semiconductor processing tool 116. The inner buffer 114 may include a robotic arm, a conveyor belt, and/or another type of device configured to remove wafers stored in the transport carrier 110 and transfer those wafers to the semiconductor processing tool 116. The semiconductor processing tool 116 may include an etching tool, a treatment tool, a deposition tool, a planarization tool, an ion implantation tool, and/or a tool that performs another type of fabrication technique. The inner buffer 114 may transfer wafers, after processing by the semiconductor processing tool 116, back into the transport carrier 110 located at the load port 112.

In some implementations, the controller 104 may transmit a command to the OHT vehicle 108 to move to the load port 112 and a command to the OHT vehicle 108 to unload the transport carrier 110. The controller 104 may further receive signals (for example, event signals as shown in FIG. 1) from the OHT vehicle 108 when the transport carrier 110 is unloaded such that the controller 104 may continue to track one or more wafers stored in the transport carrier 110.

In some implementations, the controller 104 may transmit a command to the semiconductor processing tool 116 that triggers the associated inner buffer 114 to move the wafers out of the transport carrier 110 and to the semiconductor processing tool 116 and a command to the semiconductor processing tool 116 to process the wafer. The controller 104 may further receive signals (for example, event signals as shown in FIG. 1) from the semiconductor processing tool 116 when the semiconductor processing tool 116 receives the wafers from the inner buffer 114, when the semiconductor processing tool 116 begins processing the wafers, when the semiconductor processing tool 116 finishes processing the wafers, and when the inner buffer 114 removes the wafers from the semiconductor processing tool 116. Accordingly, the controller 104 may track the wafers during processing.

The OHT vehicle 108 may further load the transport carrier 110 from the load port 112 after the inner buffer 114 moves the processed wafers back into the transport carrier 110. The controller 104 may transmit a command to the OHT vehicle 108 to load the transport carrier 110 and a command to the OHT vehicle 108 to move the transport carrier 110 back to the storage area, to a staging area in preparation for further processing, or to another load port associated with an additional semiconductor processing tool. The controller 104 may further receive signals (for example, event signals as shown in FIG. 1) from the OHT vehicle 108 when the transport carrier 110 is loaded such that the controller 104 may track one or more wafers stored in the transport carrier 110.

The number and arrangement of components shown in FIG. 1 are provided as an example. The fabrication facility 100 may include additional components, fewer components, different components, or differently arranged components than those shown in FIG. 1. Additionally, or alternatively, a set of components (e.g., one or more components) of the fabrication facility 100 may perform one or more functions described as being performed by another set of components of the fabrication facility 100.

Figure 2A:
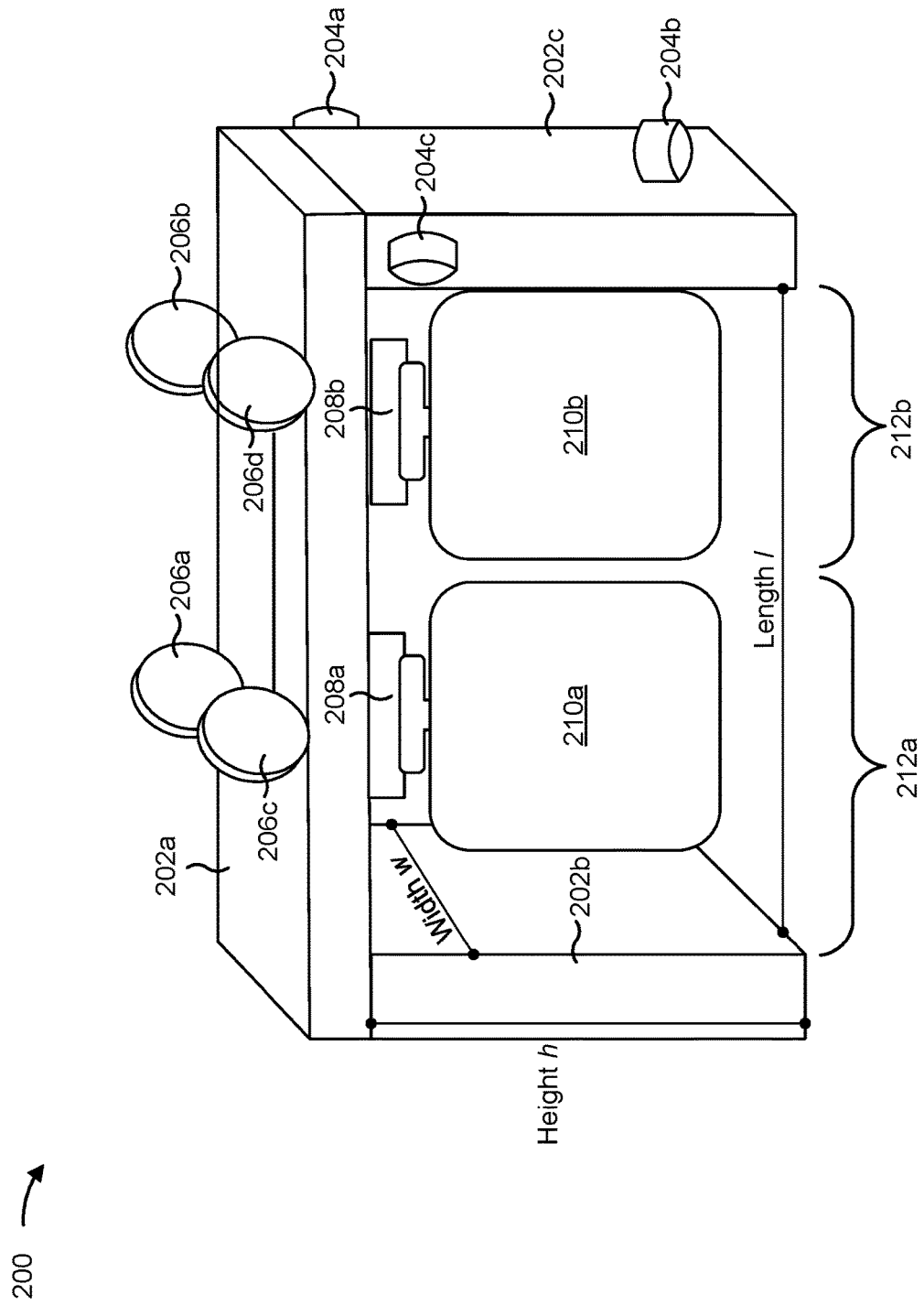
FIGS. 2A-2C are diagrams of an example OHT vehicle described herein for use in the facility of FIG. 1.
Figure 2B:
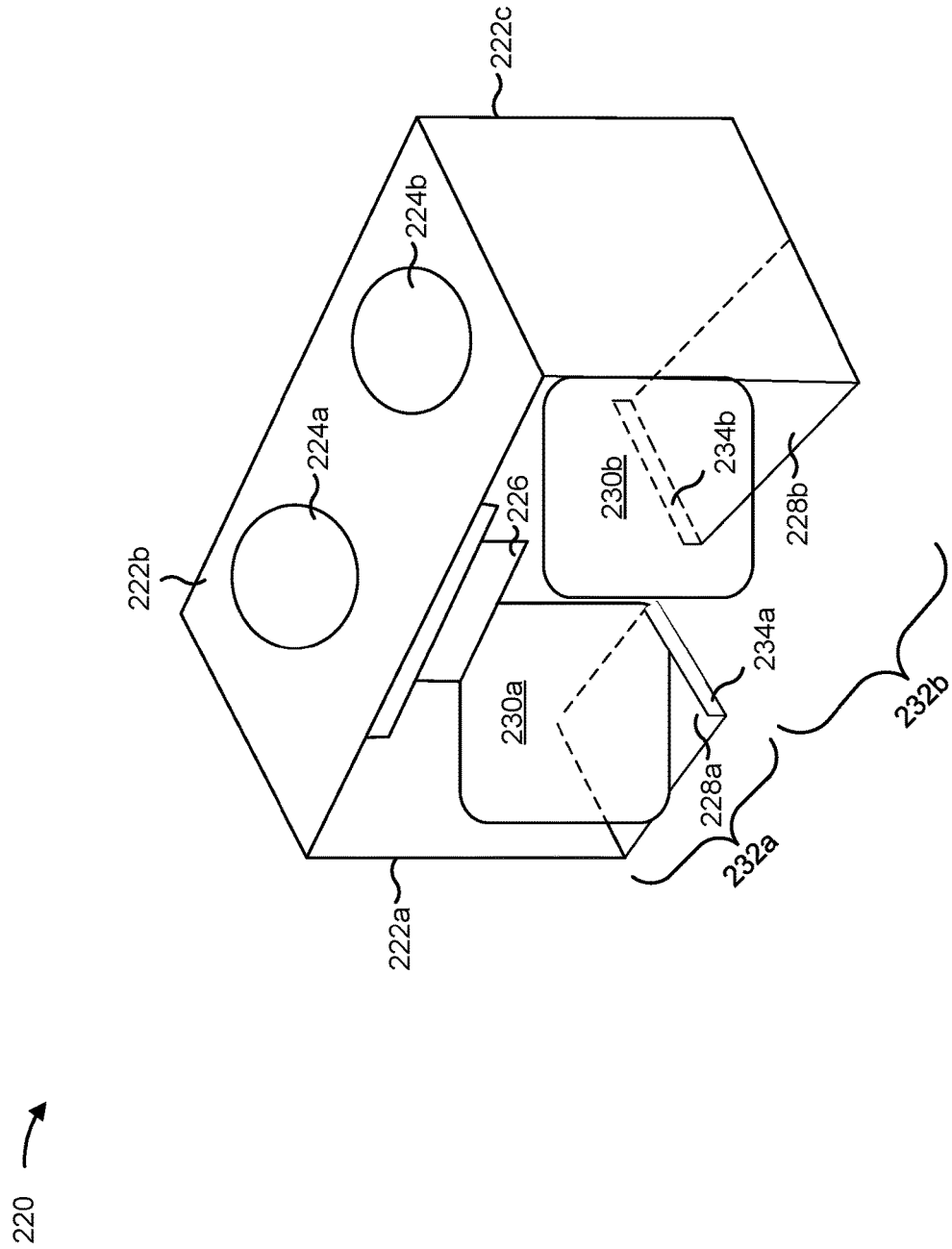
Figure 2C:
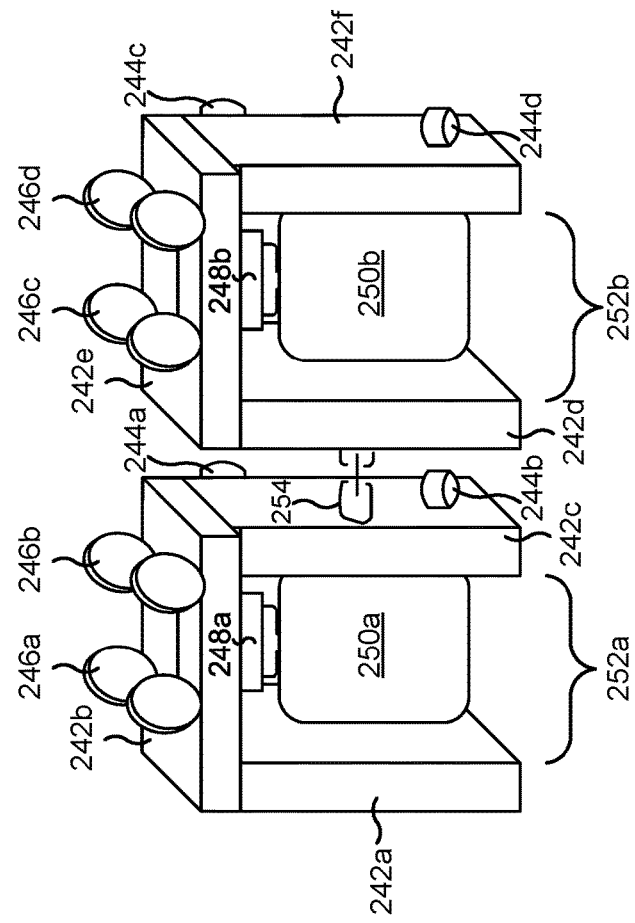

FIGS. 2A-2C are diagrams of example implementations 200, 220, and 240, respectively, associated with a multiple-buffer OHT vehicle. Example implementations 200, 220, and 240 may be included in an AMHS. The devices for the AMHS are described in more detail in connection with FIG. 1 and FIG. 4.

As shown in FIG. 2A, multiple-buffer OHT vehicle 200 may include one or more surfaces, such as surface 202a, surface 202b, and surface 202c. In some implementations, surfaces 202a, 202b, and 202c may be formed of a plastic, a metal, and/or another type of hard surface. The surfaces 202a, 202b, and 202c may partially enclose an inner volume of the multiple-buffer OHT vehicle 200. Although depicted as including three surfaces, other implementations may include fewer surfaces (for example, excluding surface 202b and/or surface 202c) or additional surfaces (for example, including one or more surfaces perpendicular to surfaces 202b and 202c). Using additional surfaces can prevent jostling of the transport carriers 210a and 210b, described in greater detail below, during movement of the multiple-buffer OHT vehicle 200. Using fewer surfaces can reduce a weight of the multiple-buffer OHT vehicle 200 and increase a speed at which the multiple-buffer OHT vehicle 200 moves.

In some implementations, the inner volume may have an associated length l, width w, and height h. For example, the length l may be approximately between 850 cm and 950 cm in order to accommodate more than one transport carrier, as described in greater detail below. Similarly, the width w may be approximately between 570 cm and 670 cm, and the height h may be approximately between 90 and 110 cm, such that the multiple-buffer OHT vehicle 200 can store more than one transport carrier in the inner volume. Although depicted as excluding the surfaces 202a, 202b, and 202c, the length l, width w, and height h may alternatively include the surfaces 202a, 202b, and 202c.

In some implementations, and as shown in FIG. 2A, the multiple-buffer OHT vehicle 200 may include one or more sensors, such as sensor 204a, sensor 204b, and sensor 204c. For example, sensor 204a, sensor 204b, and sensor 204c may include proximity sensors, cameras, and/or other types of sensors that trigger stoppage of the multiple-buffer OHT vehicle 200 when an additional multiple-buffer OHT vehicle, or another obstruction, is detected within a threshold distance of the multiple-buffer OHT vehicle 200. In some implementations, different sensors may correspond to different directions. For example, the sensor 204a may correspond to a direction along an axis associated with width w, the sensor 204b may correspond to a direction along an axis associated with length l, and the sensor 204c may correspond to an opposite direction along the axis associated with width w. Although depicted as including three sensors, the multiple-buffer OHT vehicle 200 may include fewer sensors (such as zero sensors, as shown in FIG. 2B) or additional sensors (such as four sensors, as shown in FIG. 2C). For example, the multiple-buffer OHT vehicle 200 may include one or more additional sensors on surface 202b, such as one corresponding to an opposite direction along the axis associated with length I. Using additional sensors can further reduce a risk of collision between the multiple-buffer OHT vehicle 200 and other OHT vehicles and/or obstructions. Using fewer sensors can reduce power consumption of the multiple-buffer OHT vehicle 200.

In some implementations, the multiple-buffer OHT vehicle 200 may additionally or alternatively include other types of sensors. For example, the multiple-buffer OHT vehicle 200 may include one or more proximity sensors, cameras, weight sensors, and/or other types of sensors that detect when a transport carrier is loaded into or unloaded from a buffer of the multiple-buffer OHT vehicle 200. In another example, the multiple-buffer OHT vehicle 200 may include one or more cameras, accelerometers, speedometers, and/or other types of sensors that detect when the multiple-buffer OHT vehicle 200 is moving or stationary and/or when the multiple-buffer OHT vehicle 200 is above a load port, a storage area, a staging area, and/or another portion of a fabrication facility, such as fabrication facility 100 of FIG. 1.

As further shown in FIG. 2A, the multiple-buffer OHT vehicle 200 may include one or more rollers, such as roller 206a, roller 206b, roller 206c, and roller 206d, configured to allow the multiple-buffer OHT vehicle 200 to move along an overhead track (such as overhead track 106 of FIG. 1). Rollers 206a, 206b 206c, and 206d may include wheels, guides, and/or other types of conveyance devices configured to move along the overhead track. In some implementations, one or more of rollers 206a, 206b, 206c, and 206d may be passive. Additionally, or alternatively, one or more of rollers 206a, 206b 206c, and 206d may be active such that a motor of the multiple-buffer OHT vehicle 200 drives rotation of the one or more active rollers to move the multiple-buffer OHT vehicle 200. Although depicted as including four rollers, the multiple-buffer OHT vehicle 200 may include fewer rollers (such as two rollers, as shown in FIG. 2B) or additional rollers (such as eight rollers, as shown in FIG. 2C). Using additional rollers can increase smoothness of movement of the multiple-buffer OHT vehicle 200 and thus prevent jostling of the transport carriers 210a and 210b, described in greater detail below, during the movement. Using fewer rollers can reduce a risk that the multiple-buffer OHT vehicle 200 will be rendered stationary by a defective roller.

As further shown in FIG. 2A, the multiple-buffer OHT vehicle 200 may include at least one transfer device, such as transfer device 208a and transfer device 208b, configured to selectively load or unload transport carriers 210a and 210b, respectively, into the multiple-buffer OHT vehicle 200. For example, transfer device 208a and transfer device 208b may each include a belt system, a pulley system, a hydraulic lift, and/or another type of lifting mechanism. In some implementations, the transfer devices 208a and 208b may be associated with a hydraulic motor, a rotational motor, and/or another type of motor that moves the transfer devices 208a and 208b to load or unload the transport carriers 210a and 210b, respectively. In some implementations, the transfer devices 208a and 208b may raise and lower the transport carriers 210a and 210b to fixed heights. As an alternative, the transfer devices 208a and 208b may be associated with one or more sensors, such as proximity sensors, cameras, and/or other types of sensors that detect heights of the transfer devices 208a and 208b during operation. In some implementations, the transfer devices 208a and 208b may raise or lower the transport carriers 210a and 210b, respectively, based on commands from a controller (such as controller 104 of FIG. 1). In some implementations, a controller included in the multiple-buffer OHT vehicle 200 may instruct the transfer devices 208a and 208b to raise or lower based on the commands from the controller. The transfer devices 208a and 208b may further include a claw, a magnet, and/or another type of grasping mechanism that holds the transport carriers 210a and 210b, respectively, during loading or unloading. In some implementations, the transfer devices 208a and 208b may additionally hold the transport carriers 210a and 210b, respectively, during movement of the multiple-buffer OHT vehicle 200. Using the transfer devices 208a and 208b to hold the transport carriers 210a and 210b during movement of the multiple-buffer OHT vehicle 200 may allow the multiple-buffer OHT vehicle 200 not to include one or more carriage mechanisms (as described in greater detail below). This may reduce a manufacturing cost and a weight of the multiple-buffer OHT vehicle 200 and increase a speed at which the multiple-buffer OHT vehicle 200 moves.

In some implementations, the transfer device 208a may correspond to a first buffer 212a included in the inner volume of the multiple-buffer OHT vehicle 200 such that the transfer device 208a is configured to selectively load or unload transport carriers into the first buffer 212a. Similarly, the transfer device 208b may correspond to a second buffer 212b included in the inner volume of the multiple-buffer OHT vehicle 200 such that the transfer device 208b is configured to selectively load or unload transport carriers into the second buffer 212b. Although depicted as including two transfer devices, the multiple-buffer OHT vehicle 200 may include fewer transfer devices (for example, as shown in FIG. 2B) or additional transfer devices. Using multiple transfer devices enables the multiple-buffer OHT vehicle 200 (for example, as described below in greater detail with respect to FIG. 3D) to load one transport carrier concurrently with unloading another transport carrier, which further increases efficiency. Using fewer transfer devices can reduce a manufacturing cost of the multiple-buffer OHT vehicle 200. Additionally, although depicted as including two buffers, the multiple-buffer OHT vehicle 200 may include additional buffers, such that at least one transfer device moves between at least two of the buffers (for example, as shown in FIG. 2B) and/or such that the multiple-buffer OHT vehicle 200 includes additional transfer devices corresponding to the buffers. Using additional buffers enables the multiple-buffer OHT vehicle 200 to store and move more than two transport carriers, which further increases efficiency. Using fewer buffers can reduce a manufacturing cost of the multiple-buffer OHT vehicle 200.

In some implementations, the multiple-buffer OHT vehicle 200 may further include one or more carriage mechanisms (for example, as shown in and described further in connection with FIG. 2B). The carriage mechanisms may include surfaces configured to secure transport carriers 210a and 210b within the buffers 212a and 212b, respectively. For example, a carriage mechanism may be within a few millimeters below or may be in contact with a transport carrier stored in a buffer corresponding to the carriage mechanism in order to reduce jostling of the transport carrier while the multiple-buffer OHT vehicle 200 moves (for example, along overhead track 106 as shown in FIG. 1). Reducing jostling reduces a risk that wafers stored in the transport carrier will be damaged in transit, which reduces waste.

In some implementations, the one or more carriage mechanisms may be retractable. For example, the multiple-buffer OHT vehicle 200 may open a carriage mechanism corresponding to the buffer 212a (for example, by swinging the carriage mechanism on one or more hinges from a position perpendicular to surface 202b to a position parallel to surface 202b or by sliding the carriage mechanism away from an opening associated with the buffer 212a) in order to load or unload the transport carrier 210a. Additionally, the multiple-buffer OHT vehicle 200 may close a carriage mechanism corresponding to the buffer 212a (for example, by swinging the carriage mechanism on one or more hinges from a position parallel to surface 202b to a position perpendicular to surface 202b or by sliding the carriage mechanism towards an opening associated with the buffer 212a) in order to secure the transport carrier 210a while the multiple-buffer OHT vehicle 200 moves.

FIG. 2B depicts a multiple-buffer OHT vehicle 220, which is similar to multiple-buffer OHT vehicle 200 of FIG. 2A. As shown in FIG. 2B, the multiple-buffer OHT vehicle 220 may include one or more surfaces, such as surface 222a, surface 222b, and surface 222c. The one or more surfaces 222a, 222b, and 222c may partially enclose an inner volume of the multiple-buffer OHT vehicle 220. In some implementations, surfaces 222a, 222b, and 222c may be formed of a plastic, a metal, and/or another type of hard surface. Similar to the multiple-buffer OHT vehicle 200, other implementations may include fewer surfaces or additional surfaces. In some implementations, the inner volume may correspond to the inner volume of multiple-buffer OHT vehicle 200, as described above with respect to FIG. 2A, and have a similar associated length l, width w, and height h.

In some implementations, the multiple-buffer OHT vehicle 220 may include zero or more sensors. When the multiple-buffer OHT vehicle 220 includes one or more sensors, these sensors may be similar to those sensors described above with respect to FIG. 2A. As further shown in FIG. 2B, the multiple-buffer OHT vehicle 220 may include one or more rollers, such as roller 224a and roller 224b, configured to allow the multiple-buffer OHT vehicle 220 to move along an overhead track (such as overhead track 106 of FIG. 1). The one or more rollers may be similar to the one or more rollers described above in connection with FIG. 2A. Although depicted as including two rollers, the multiple-buffer OHT vehicle 200 may include fewer rollers (such as a single roller) or additional rollers (such as four rollers, as shown in FIG. 2A, or eight rollers, as shown in FIG. 2C).

As further shown in FIG. 2B, the multiple-buffer OHT vehicle 220 may include a single transfer device, such as transfer device 226, configured to selectively load or unload transport carriers 230a and 230b into the multiple-buffer OHT vehicle 220. For example, transfer device 226 may include a belt system, a pulley system, a hydraulic lift, and/or another type of lifting mechanism, as described above in connection with FIG. 2A.

In some implementations, and as further shown in FIG. 2B, the multiple-buffer OHT vehicle 220 may further include one or more carriage mechanisms, such as carriage mechanism 228a and carriage mechanism 228b. For example, the multiple-buffer OHT vehicle 220 may open the carriage mechanism 228a corresponding to the buffer 232a (for example, by swinging the carriage mechanism 228a on one or more hinges from a position perpendicular to surface 222a to a position parallel to surface 222a or by sliding the carriage mechanism 228a away from an opening associated with the buffer 232a) in order to load or unload the transport carrier 230a. Additionally, the multiple-buffer OHT vehicle 220 may close the carriage mechanism 228a corresponding to the buffer 232a (for example, by swinging the carriage mechanism 228a on one or more hinges from a position parallel to surface 222a to a position perpendicular to surface 222a or by sliding the carriage mechanism towards an opening associated with the buffer 232a) in order to secure the transport carrier 230a while the multiple-buffer OHT vehicle 220 moves.

The carriage mechanism 228a may secure the transport carrier 230a, and the carriage mechanism 228b may secure the transport carrier 230b. For example, the carriage mechanism 228a may support a weight of the transport carrier 230a after the transfer device 226 releases the transport carrier 230a and/or while the multiple-buffer OHT vehicle 220 moves (for example, along overhead track 106 as shown in FIG. 1). Similarly, the carriage mechanism 228b may support a weight of the transport carrier 230b after the transfer device 226 releases the transport carrier 230b and/or while the multiple-buffer OHT vehicle 220 moves. Accordingly, as further shown in FIG. 2B, the carriage mechanism 228a may include at least one lip 234a that prevents the transport carrier 310a from sliding during movement of the multiple-buffer OHT vehicle 220. Similarly, the carriage mechanism 228b may include at least one lip 234b that prevents the transport carrier 310b from sliding during movement of the multiple-buffer OHT vehicle 220. Although depicted as each including a single lip, the carriage mechanisms 228a and 228b may include additional lips. Using additional lips prevents sliding of the transport carriers 310a and 310b during movement along different axes, which increases a flexibility of the multiple-buffer OHT vehicle 220 by allowing for more directions of movement. Using fewer lips can reduce a manufacturing cost of the multiple-buffer OHT vehicle 220.

In some implementations, the transfer device 226 may move between a first buffer 232a (included in the inner volume of the multiple-buffer OHT vehicle 220) and a second buffer 232b (included in the inner volume of the multiple-buffer OHT vehicle 220). Accordingly, the transfer device 226 is configured to move above the first buffer 232a in order to selectively load or unload transport carriers into the first buffer 232a and move above the second buffer 232b in order to selectively load or unload transport carriers into the second buffer 232b. Accordingly, the carriage mechanism 228a may open (as described in greater detail above with respect to FIG. 2A) while the transfer device 226 loads the transport carrier 230a into or unloads the transport carrier 230a from the first buffer 232a. The carriage mechanism 228a may close (as described in greater detail above with respect to FIG. 2A) after the transfer device 226 loads the transport carrier 230a into the first buffer 232a such that the carriage mechanism 228a can secure the transport carrier 230a while the transfer device 226 moves above the second buffer 232b and/or while the multiple-buffer OHT vehicle 220 moves. Using carriage mechanisms that retract can increase a speed at which the multiple-buffer OHT vehicle 220 can load and unload transport carriers because the transfer devices can load or unload the transport carriers directly into or from the buffers.

As an alternative, the transfer device 226 may move between the first buffer 232a, a central position (such as the position depicted in FIG. 2B), and the second buffer 232b. For example, the central position may be above a space between the carriage mechanism 228a and the carriage mechanism 228b. Accordingly, the transfer device 226 may move to the central position in order to lift a transport carrier through the space between the carriage mechanism 228a and the carriage mechanism 228b, such that the carriage mechanism 228a or the carriage mechanism 228b do not open during loading. Additionally, the transfer device 226 may move the transport carrier to the first buffer 232a or the second buffer 232b after loading using the central position and lower the transport carrier onto the carriage mechanism 228a or the carriage mechanism 228b, respectively. Similarly, the transfer device 226 may unload a transport carrier from the first buffer 232a or the second buffer 232b by lifting the transport carrier off the carriage mechanism 228a or the carriage mechanism 228b, respectively. Additionally, the transfer device 226 may move the transport carrier to the central position in order to lower the transport carrier through the space between the carriage mechanism 228a and the carriage mechanism 228b, such that the carriage mechanism 228a or the carriage mechanism 228b do not open during unloading. Using carriage mechanisms that do not retract can reduce a manufacturing cost and power consumption of the multiple-buffer OHT vehicle 220.

Although depicted as including a single transfer device 226, the multiple-buffer OHT vehicle 220 may include additional transfer devices (for example, as depicted in FIGS. 2A and 2C). Additionally, although depicted as including two buffers, the multiple-buffer OHT vehicle 200 may include additional buffers, such that the transfer device 226 moves between more than two buffers and/or such that the multiple-buffer OHT vehicle 220 includes additional transfer devices corresponding to the buffers.

FIG. 2C depicts a multiple-buffer OHT vehicle 240, which is similar to multiple-buffer OHT vehicle 200 of FIG. 2A. As shown in FIG. 2C, the multiple-buffer OHT vehicle 240 may include one or more surfaces, such as surface 242a, surface 242b, surface 242c, surface 242d, surface 242e, and surface 242f. The one or more surfaces 242a, 242b, 242c, 242d, 242e, and 242f may at least partially enclose at least two inner volumes of the multiple-buffer OHT vehicle 240. In some implementations, surfaces 242a, 242b, 242c, 242d, 242e, and 242f may be formed of a plastic, a metal, and/or another type of hard surface. Similar to the multiple-buffer OHT vehicle 200, other implementations may include fewer surfaces or additional surfaces. In some implementations, and as described above in greater detail with respect to FIG. 2A, each inner volume may have an associated length l, width w, and height h. For example, each inner volume may be associated with a length l between approximately between 425 cm and 475 cm in order to accommodate a single transport carrier, as described in greater detail below. Similarly, the width w may be approximately between 570 cm and 670 cm, and the height h may be approximately between 90 and 110 cm, such that each inner volume can store a single transport carrier. Although depicted as excluding the surfaces, the length l, width w, and height h may alternatively include the surfaces.

In some implementations, and as shown in FIG. 2C, the multiple-buffer OHT vehicle 240 may include one or more sensors, such as sensor 244a, sensor 244b, sensor 244c, and sensor 244d. Although depicted as including four sensors, the multiple-buffer OHT vehicle 240 may include fewer sensors (such as zero sensors, as shown in FIG. 2B, or three sensors, as shown in FIG. 2C) or additional sensors. When the multiple-buffer OHT vehicle 240 includes one or more sensors, these sensors may be similar to those sensors described above with respect to FIG. 2A. In some implementations, and as described in greater detail below, one or more of the sensors, such as sensor 244a and sensor 244b, may be disabled during operation of the multiple-buffer OHT vehicle 240.

As further shown in FIG. 2C, the multiple-buffer OHT vehicle 200 may include one or more rollers, such as roller 246a, roller 246b, roller 246c, and roller 246d, configured to allow the multiple-buffer OHT vehicle 240 to move along an overhead track (such as overhead track 106 of FIG. 1). The one or more rollers may be similar to the one or more rollers described above in connection with FIG. 2A. Although depicted as including eight rollers, the multiple-buffer OHT vehicle 240 may include fewer rollers (such as four rollers, as shown in FIG. 2A, or two rollers, as shown in FIG. 2B) or additional rollers.

As further shown in FIG. 2C, the multiple-buffer OHT vehicle 240 may include at least one transfer device, such as transfer device 248a and transfer device 248b, configured to selectively load or unload transport carriers 250a and 250b, respectively, into the multiple-buffer OHT vehicle 240. For example, transfer device 248a and transfer device 248b may each include a belt system, a pulley system, a hydraulic lift, and/or another type of lifting mechanism, as described above in connection with FIG. 2A.

In some implementations, the transfer device 248a may correspond to a first buffer 252a included in the inner volume of the multiple-buffer OHT vehicle 240 such that the transfer device 248a is configured to selectively load or unload transport carriers into the first buffer 252a. Similarly, the transfer device 248b may correspond to a second buffer 252b included in the inner volume of the multiple-buffer OHT vehicle 240 such that the transfer device 248b is configured to selectively load or unload transport carriers into the second buffer 252b.

In some implementations, and as described above in greater detail with respect to FIGS. 2A and 2B, the multiple-buffer OHT vehicle 240 may further include one or more carriage mechanisms (for example, as shown in FIG. 2B). The carriage mechanisms may include surfaces configured to secure transport carriers 250a and 250b. In some implementations, and as described above in greater detail with respect to FIGS. 2A and 2B, the one or more carriage mechanisms may be retractable (for example, by swinging, sliding, and/or otherwise opening and closing).

As further shown in FIG. 2C, the multiple-buffer OHT vehicle 240 may include at least one connection element, such as connection element 254. For example, the connection element 254 may include a physical connection, such as chain, a rope, a hook, a magnet, and/or another type of attachment device and/or a logical connection, implemented in software and/or hardware, that couples two or more single-buffer OHT vehicles together to form the multiple-buffer OHT vehicle 240. Accordingly, one or more sensors, such as sensor 244a and sensor 244b, may be disabled during coupling of the single-buffer OHT vehicles together and operation of the multiple-buffer OHT vehicle 240. By joining single-buffer OHT vehicles together, implementation costs may be reduced as compared with manufacturing a multiple-buffer OHT vehicle. Although depicted as coupling two single-buffer OHT vehicles, other implementations may include one or more multiple-buffer OHT vehicles (for example, as shown in FIGS. 2A and/or 2B) coupled with one or more single-buffer OHT vehicles using one or more connection elements, or may include a plurality of multiple-buffer OHT vehicles coupled together using one or more connection elements. By joining one or more multiple-buffer OHT vehicles with each other and/or with one or more single-buffer OHT vehicles, efficiency may be further increased because additional transport carriers may be stored (for example, as described in greater detail below with respect to FIG. 3A), pre-loaded (for example, as described in greater detail below with respect to FIG. 3B), and/or exchanged (for example, as described in greater detail below with respect to FIGS. 3C, 3D, and 3E) as compared with a single multiple-buffer OHT vehicle.

Accordingly, although depicted as including two buffers, the multiple-buffer OHT vehicle 240 may include additional buffers by including one or more multiple-buffer OHT vehicles coupled together and/or coupled with one or more single-buffer OHT vehicles. In some implementations, the multiple-buffer OHT vehicle 240 may include fewer transfer devices than buffers such that at least one transfer device moves between at least two of the buffers, such as between buffers of a multiple-buffer OHT vehicle that is coupled to another multiple-buffer OHT vehicle and/or with one or more single-buffer OHT vehicles.

As indicated above, FIGS. 2A-2C are provided as examples. Other examples may differ from what is described with regard to FIGS. 2A-2C. The number and arrangement of devices shown in FIGS. 2A-2C are provided as examples. In practice, there may be additional devices, fewer devices, different devices, or differently arranged devices than those shown in FIGS. 2A-2C. Furthermore, two or more devices shown in FIGS. 2A-2C may be implemented within a single device, or a single device shown in FIGS. 2A-2C may be implemented as multiple, distributed devices. Additionally, or alternatively, a set of devices (e.g., one or more devices) shown in FIGS. 2A-2C may perform one or more functions described as being performed by another set of devices shown in FIGS. 2A-2C.

FIGS. 3A-3E are diagrams of example implementations 300, 320, 340, 360, and 380, respectively, associated with using a multiple-buffer OHT vehicle. As shown in FIGS. 3A-3E, example implementations 300, 320, 340, 360, and 380 may use a multiple-buffer OHT vehicle. The multiple-buffer OHT vehicle may correspond to a multiple-buffer OHT vehicle described in connection with FIGS. 2A-2C.

Figure 3A:
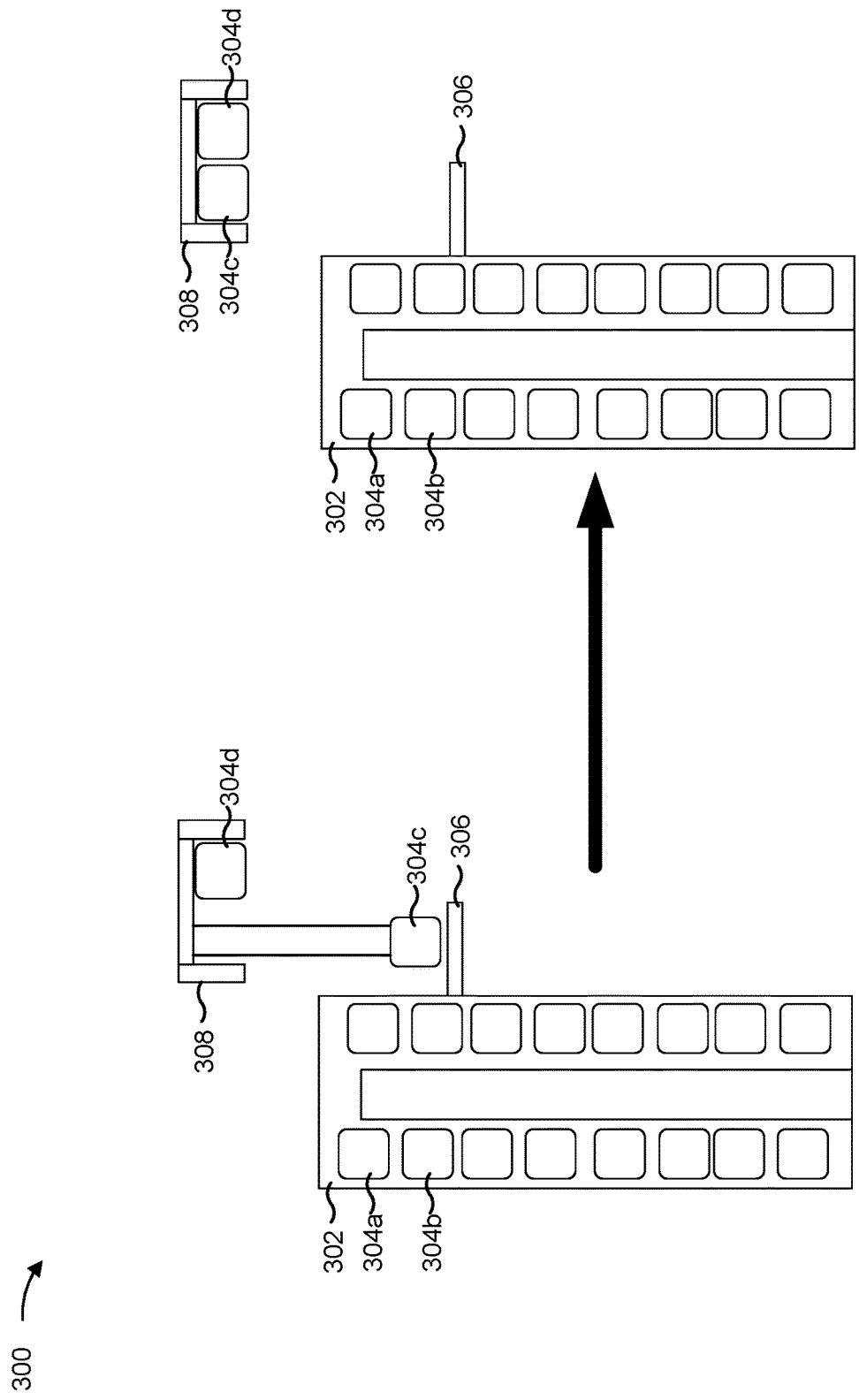
FIGS. 3A-3E are diagrams of an example implementation described herein.

As shown in FIG. 3A, a storage area 302 (for example, a storage rack) may store a plurality of transport carriers (for example, transport carriers 304a, 304b, and 304c). In some implementations, the storage area 302 may further include a staging area 306 from which OHT vehicles may load transport carriers. Accordingly, in an air storage mode 300, a multiple-buffer OHT vehicle 308 may load at least one transport carrier (for example, transport carrier 304c) from the storage area 302 (for example, from the staging area 306 of the storage area 302). In some implementations, the multiple-buffer OHT vehicle 308 may load the transport carrier 304c by lifting the transport carrier 304c using at least one transfer device and storing the transport carrier 304c in a buffer. In some implementations, the multiple-buffer OHT vehicle 308 may store the transport carrier 304c with one or more additional transport carriers (for example, the transport carrier 304d). In air storage mode 300, the multiple-buffer OHT vehicle 308 may thus increase storage capacity of an AMHS in which the multiple-buffer OHT vehicle 308 is included. For example, the AMHS may process about 10% larger volume of transport carriers by storing some transport carriers on the multiple-buffer OHT vehicle 308 during fabrication processes.

Figure 3B:
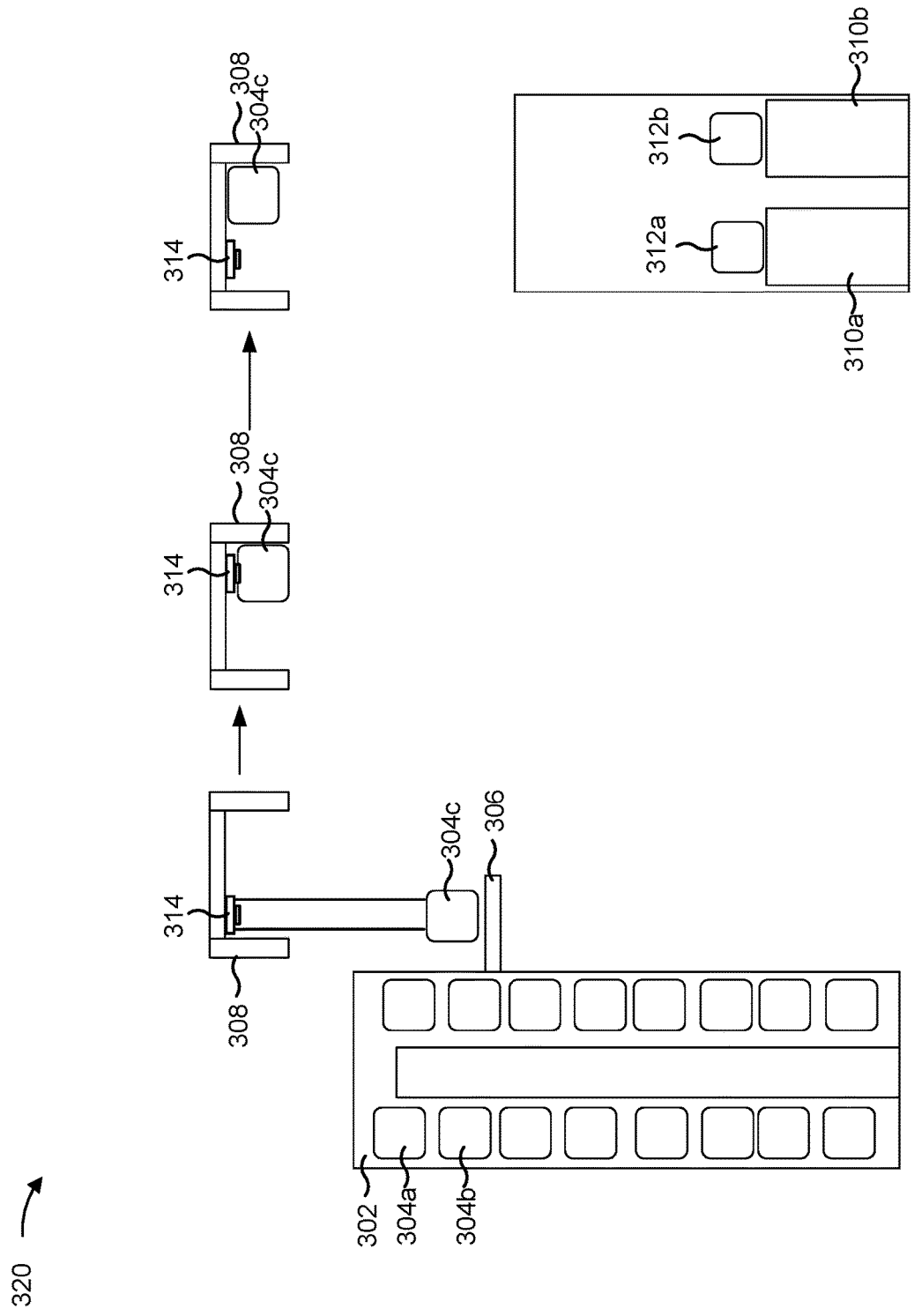

As shown in FIG. 3B, a storage area 302 may store a plurality of transport carriers (for example, transport carriers 304a, 304b, and 304c), as described above with respect to FIG. 3A. In a pre-transfer mode 320, a multiple-buffer OHT vehicle 308 may load at least one transport carrier (for example, transport carrier 304c) from the storage area 302 (for example, from the staging area 306 of the storage area 302). In some implementations, the multiple-buffer OHT vehicle 308 may load the transport carrier 304c by lifting the transport carrier 304c using at least one transfer device 314.

As further shown in FIG. 3B, the multiple-buffer OHT vehicle 308 may load the transport carrier 304c into the multiple-buffer OHT vehicle 308 while a semiconductor processing tool, associated with a load port (such as load port 310a or load port 310b), is processing one or more wafers associated with another transport carrier (such as transport carrier 312a or transport carrier 312b, respectively). For example, the multiple-buffer OHT vehicle 308 may receive, from a controller (such as controller 104) a command to move to the storage area 302 and a command to load the transport carrier 304c while a semiconductor processing tool is processing the one or more wafers associated with the transport carrier 312a or transport carrier 312b. In some implementations, the controller may send the command within a configured amount of time before an estimated completion time of processing of the one or more wafers by the semiconductor processing tool. For example, the amount of time may be based on an estimated amount of time for the multiple-buffer OHT vehicle 308 to load the transport carrier 304c and the estimated completion time. Accordingly, the controller may reduce an amount of time between completion of processing of the one or more wafers and loading the transport carrier 304c at the storage area 302, which increases efficiency of an AMHS in which the multiple-buffer OHT vehicle 308 is included.

As further shown in FIG. 3B, the transfer device 314 may be configured to move between a first buffer and a second buffer of the multiple-buffer OHT vehicle 308. For example, the transfer device 314 may have moved to the first buffer in order to load the transport carrier 304c. As an alternative, the transfer device 314 may have moved to a central position in order to load the transport carrier 304c, as described above in greater detail with respect to FIG. 2B. The transfer device 314 may further move to the second buffer, with the transport carrier 304c, in order to store the transport carrier 304c. Accordingly, the transfer device 314 may lower the transport carrier 304c onto a corresponding carriage mechanism and move back to the first buffer or the central position in preparation for loading the transport carrier 312a into the first buffer. As an alternative, the multiple-buffer OHT vehicle 308 may include a plurality of transfer devices, as described above in greater detail with respect to FIGS. 2A and 2C, and each of these plurality of transfer devices may be responsible for loading or unloading a corresponding transport carrier.

As further shown in FIG. 3B, the multiple-buffer OHT vehicle 308 may position itself above the load port 310a in preparation for loading the transport carrier 312a into the first buffer of the multiple-buffer OHT vehicle 308 while the multiple-buffer OHT vehicle 308 retains the transport carrier 304c in the second buffer. For example, the multiple-buffer OHT vehicle 308 may receive, from the controller (such as controller 104), a command to move above the load port 310a while the semiconductor processing tool is processing the one or more wafers associated with the transport carrier 312a. In some implementations, the controller may send the command within a configured amount of time before the estimated completion time of processing of the one or more wafers by the semiconductor processing tool. For example, the amount of time may be based on an estimated amount of time for the multiple-buffer OHT vehicle 308 to position itself above the load port 310a and the estimated completion time. Accordingly, the controller may reduce an amount of time between completion of processing of the one or more wafers and loading the transport carrier 312a from the load port 310a, which increases efficiency of an AMHS in which the multiple-buffer OHT vehicle 308 is included.

Figure 3C:
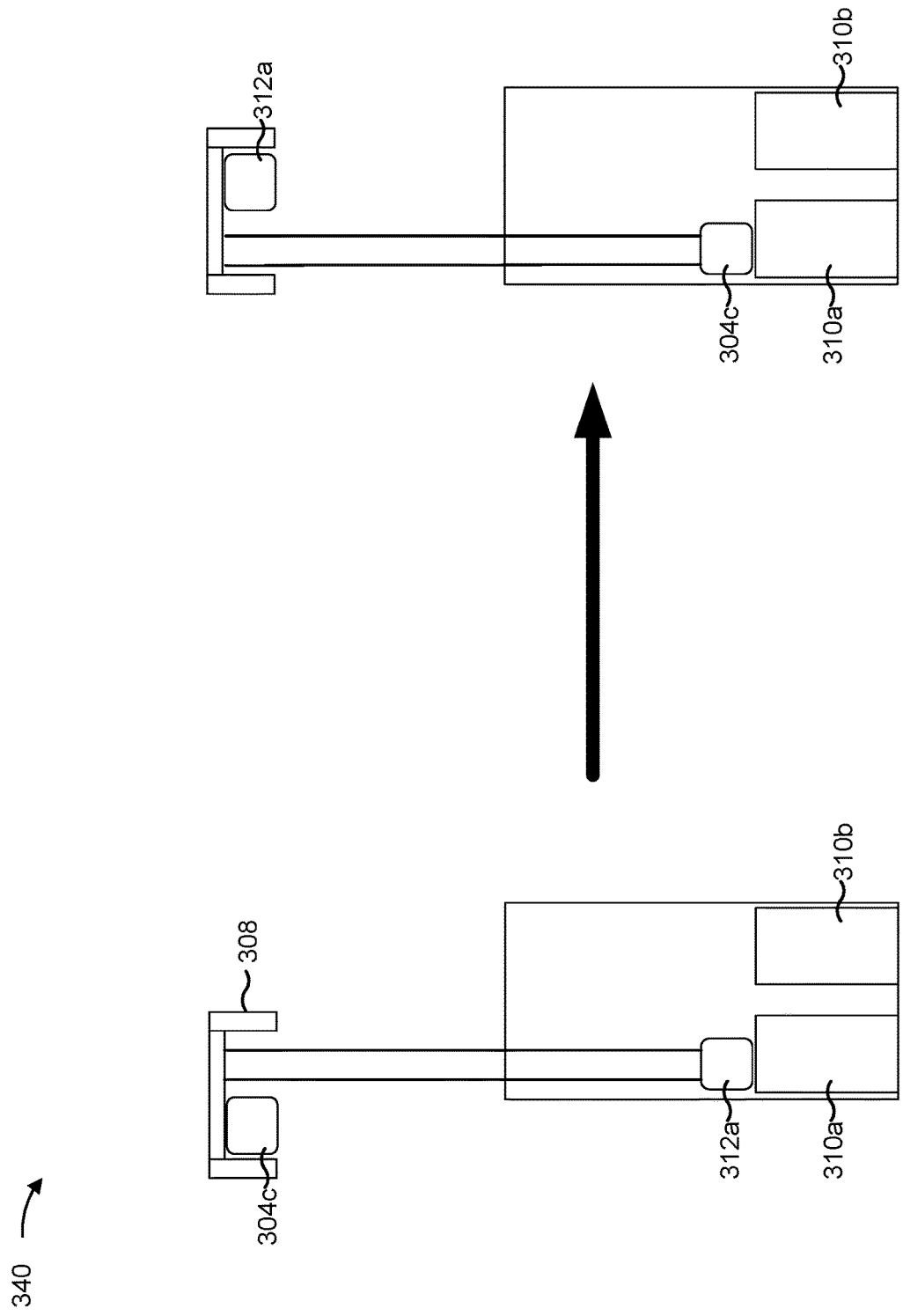

As shown in FIG. 3C, in an exchange transfer mode 340, a multiple-buffer OHT vehicle 308 may load, from a load port 310a and into a first buffer of the multiple-buffer OHT vehicle 308, a first transport carrier 312a that stores or more processed wafers (e.g., processed by a semiconductor processing tool associated with the load port 310a). Additionally, the multiple-buffer OHT vehicle 308 may unload, from a second buffer of the multiple-buffer OHT vehicle 308 and to the load port 310a, a second transport carrier 304c that stores one or more wafers for processing (e.g., by the semiconductor processing tool associated with the load port 310a), while the first buffer retains the first transport carrier 312a. For example, the multiple-buffer OHT vehicle 308 may receive, from a controller (such as controller 104), a first command to load the transport carrier 312a. Additionally, the multiple-buffer OHT vehicle 308 may receive, from the controller, a second command to unload the transport carrier 304c. In some implementations, the controller may send the second command before the multiple-buffer OHT vehicle 308 has completed processing the first command. For example, the controller may send the second command before the multiple-buffer OHT vehicle 308 completes uploading of the transport carrier 312a and/or moves the transport carrier 312a to another location (such as the storage area 302, another staging area, or another load port associated with a different semiconductor processing tool). Accordingly, the controller may minimize an amount of time between loading of the transport carrier 312a and unloading of the transport carrier 304c, which increases efficiency of an AMHS in which the multiple-buffer OHT vehicle 308 is included.

Figure 3D:
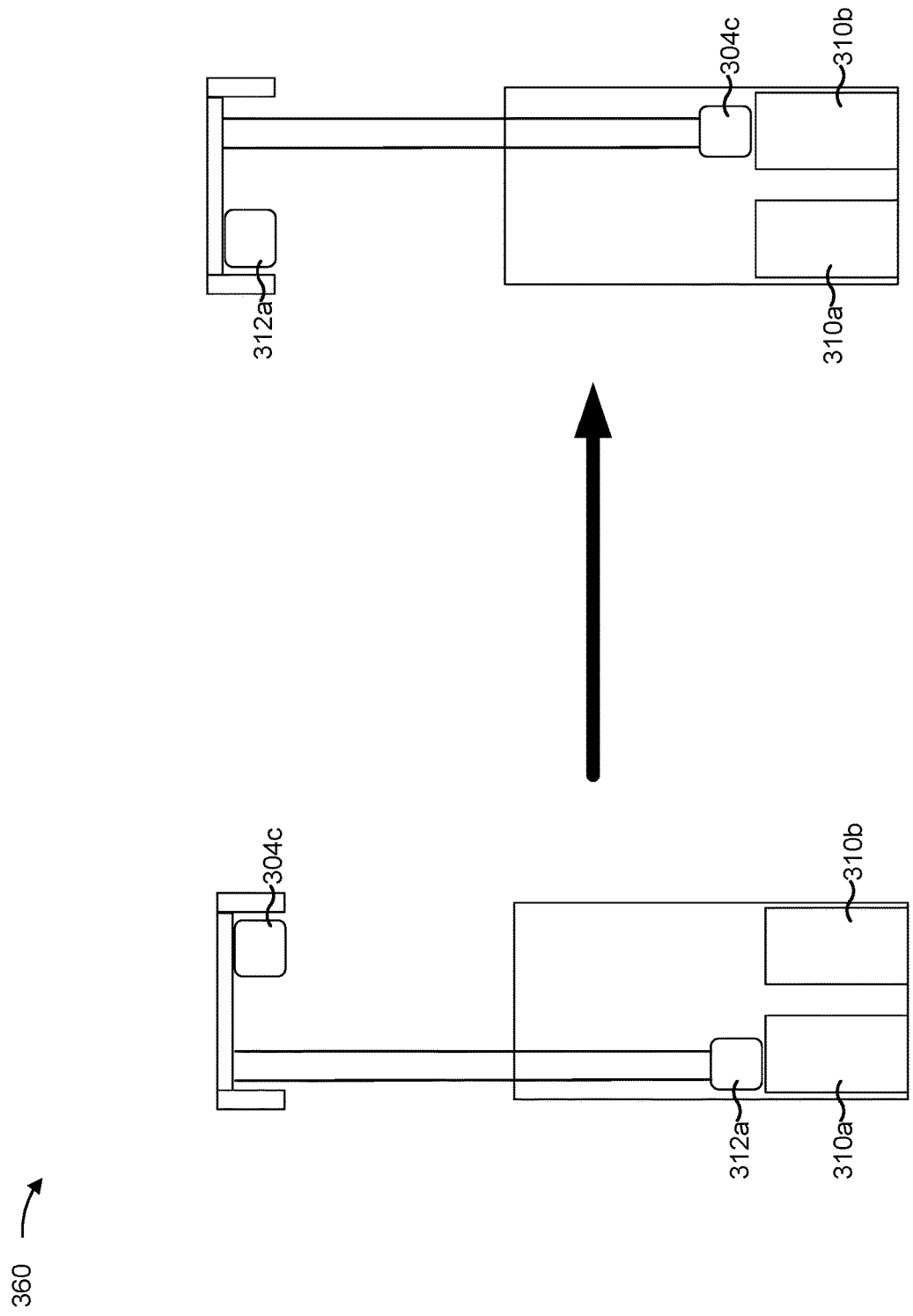

As shown in FIG. 3D, in an exchange transfer mode 360, a multiple-buffer OHT vehicle 308 may load, from a load port 310a and into a first buffer of the multiple-buffer OHT vehicle 308, a first transport carrier 312a that stores or more processed wafers (e.g., processed by a semiconductor processing tool associated with the load port 310a). Additionally, the multiple-buffer OHT vehicle 308 may unload, from a second buffer of the multiple-buffer OHT vehicle 308 and to the load port 310b, a second transport carrier 304c that stores one or more wafers for processing (e.g., by a semiconductor processing tool associated with the load port 310b), while the first buffer retains the first transport carrier 312a. In some implementations, the multiple-buffer OHT vehicle 308 may unload the transport carrier 304c from the second buffer to the load port 310b before loading the transport carrier 312a into the first buffer from the load port 310a. As an alternative, the multiple-buffer OHT vehicle 308 may unload the transport carrier 304c from the second buffer to the load port 310b while loading the transport carrier 312a into the first buffer from the load port 310a. For example, the multiple-buffer OHT vehicle 308 may include a plurality of transfer devices (as described above in greater detail with respect to FIGS. 2A and 2C) such that the multiple-buffer OHT vehicle 308 may load the transport carrier 312a into the first buffer using a first transfer device concurrently with unloading the transport carrier 304c from the second buffer using a second transfer device.

The multiple-buffer OHT vehicle 308 may receive, from a controller (such as controller 104), a first command to load the transport carrier 312a. Additionally, the multiple-buffer OHT vehicle 308 may receive, from the controller, a second command to unload the transport carrier 304c. In some implementations, the controller may send the first command concurrently with the second command. Accordingly, the controller may minimize an amount of time between loading of the transport carrier 312a and unloading of the transport carrier 304c, which increases efficiency of an AMHS in which the multiple-buffer OHT vehicle 308 is included.

Figure 3E:
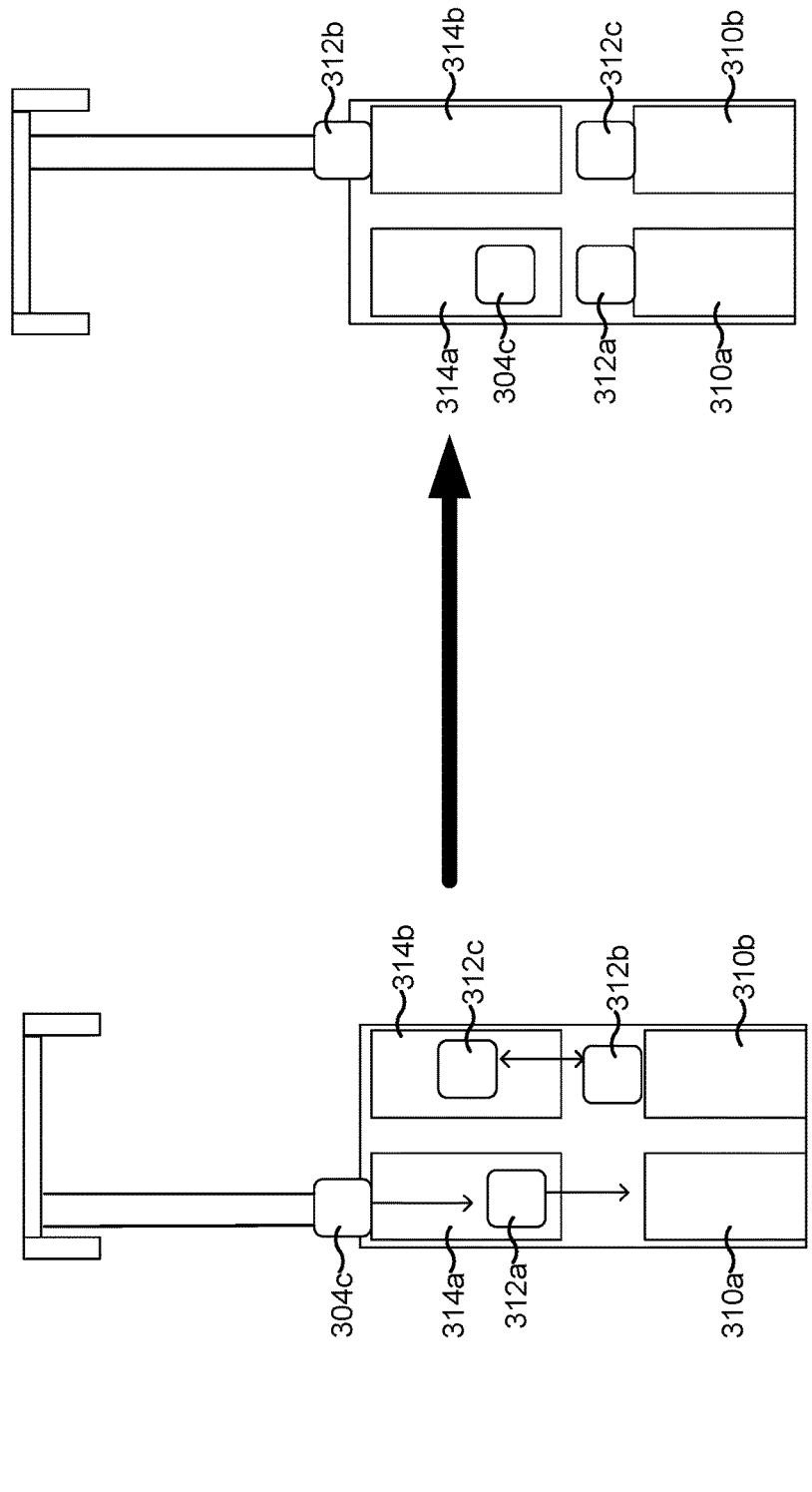

As shown in FIG. 3E, in an exchange transfer mode 380, a multiple-buffer OHT vehicle 308 may unload, into a buffer station 314a and from a first buffer of the multiple-buffer OHT vehicle 308, a transport carrier 304c that stores one or more wafers for processing (e.g., by a semiconductor processing tool associated with the load port 310a). For example, the buffer station 314a may include a near-transfer buffer and/or another system configured to store transport carriers, transfer stored transport carriers to the load port 310a, and receive transport carriers storing processed wafers from the load port 310a. Accordingly, the buffer station 314a may move the transport carrier 304c onto the load port 310a. Similarly, the buffer station 314b may exchange a transport carrier 312b storing processed wafers at the load port 310b with a transport carrier 312c storing wafers for processing (e.g., by a semiconductor processing tool associated with the load port 310b). Accordingly, the multiple-buffer OHT vehicle 308 may load, from the buffer station 314b and into a second buffer of the multiple-buffer OHT vehicle 308, the transport carrier 312b. In some implementations, the multiple-buffer OHT vehicle 308 may load the transport carrier 312b to the second buffer from the buffer station 314b before unloading the transport carrier 304a from the first buffer into the buffer station 314a. As an alternative, the multiple-buffer OHT vehicle 308 may unload the transport carrier 304c from the first buffer to the buffer station 314a while loading the transport carrier 312b into the second buffer from the buffer station 314b. For example, the multiple-buffer OHT vehicle 308 may include a plurality of transfer devices (as described above in greater detail with respect to FIGS. 2A and 2C) such that the multiple-buffer OHT vehicle 308 may load the transport carrier 312b into the second buffer using a first transfer device concurrently with unloading the transport carrier 304c from the first buffer using a second transfer device.

The multiple-buffer OHT vehicle 308 may receive, from a controller (such as controller 104), a first command to load the transport carrier 312b. Additionally, the multiple-buffer OHT vehicle 308 may receive, from the controller, a second command to unload the transport carrier 304c. In some implementations, the controller may send the first command concurrently with the second command. Accordingly, the controller may minimize an amount of time between loading of the transport carrier 312b and unloading of the transport carrier 304c, which increases efficiency of an AMHS in which the multiple-buffer OHT vehicle 308 is included.

As indicated above, FIGS. 3A-3E are provided as examples. Other examples may differ from what is described with regard to FIGS. 3A-3E. The number and arrangement of devices shown in FIGS. 3A-3E are provided as examples. In practice, there may be additional devices, fewer devices, different devices, or differently arranged devices than those shown in FIGS. 3A-3E. Furthermore, two or more devices shown in FIGS. 3A-3E may be implemented within a single device, or a single device shown in FIGS. 3A-3E may be implemented as multiple, distributed devices. Additionally, or alternatively, a set of devices (e.g., one or more devices) shown in FIGS. 3A-3E may perform one or more functions described as being performed by another set of devices shown in FIGS. 3A-3E.

FIG. 4 is a diagram of example components of a device 400, which may correspond to controller 104, OHT vehicle 108, 200, 220, 240, and/or 308, load port 112 or 310, and/or semiconductor processing tool 116. In some implementations, the controller 104, the OHT vehicle 108, 200, 220, 240, and/or 308, the load port 112 or 310, and/or the semiconductor processing tool 116 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
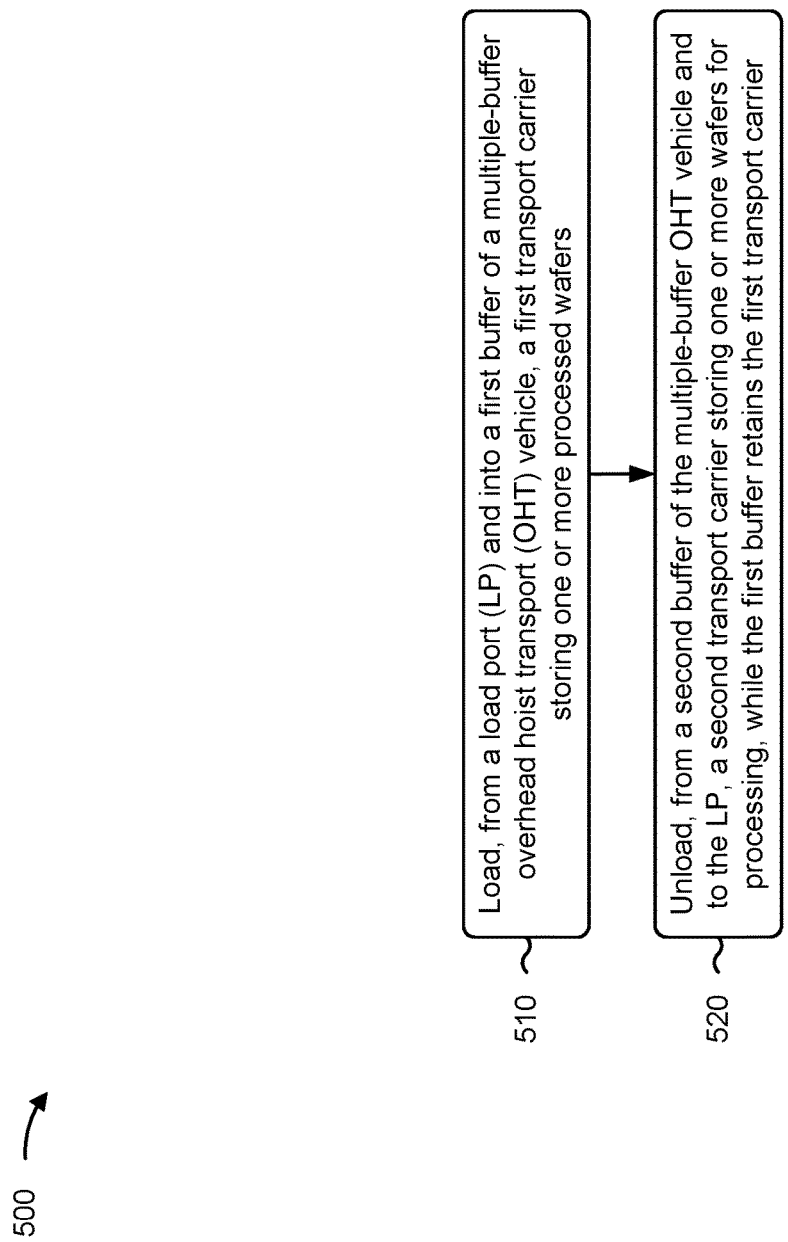
FIGS. 5 and 6 are flowcharts of example processes relating to using a multiple-buffer OHT vehicle.

FIG. 5 is a flowchart of an example process 500 associated with a multiple-buffer OHT vehicle and method of using the same. In some implementations, one or more process blocks of FIG. 5 may be performed by an OHT vehicle (e.g., OHT vehicle 108, 200, 220, 240, and/or 308). In some implementations, one or more process blocks of FIG. 5 may be performed by another device or a group of devices separate from or including the OHT vehicle, such as a controller (e.g., controller 104), a load port (e.g., load port 112 or 310), and/or a semiconductor processing tool (e.g., semiconductor processing tool 116). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include loading, from a load port and into a first buffer of a multiple-buffer OHT vehicle, a first transport carrier storing one or more processed wafers (block 510). For example, the OHT vehicle (e.g., the OHT vehicle 108, 200, 220, 240, and/or 308) may load, from the load port (e.g., the load port 112 or 310) and into the first buffer (e.g., the first buffer 212a, 232a, and/or 252a), the first transport carrier (e.g., the first transport carrier 210a, 230a, and/or 250a) storing one or more processed wafers, as described above.

As further shown in FIG. 5, process 500 may include unloading, from a second buffer of the multiple-buffer OHT vehicle and to the load port, a second transport carrier storing one or more wafers for processing, while the first buffer retains the first transport carrier (block 520). For example, the OHT vehicle (e.g., the OHT vehicle 108, 200, 220, 240, and/or 308) may unload, from a second buffer (e.g., the second buffer 212b, 232b, and/or 252b) and to the load port (e.g., the load port 112 or 310), the second transport carrier (e.g., the second transport carrier 210b, 230b, and/or 250b) storing one or more wafers for processing, while the first buffer (e.g., the first buffer 212a, 232a, and/or 252a) retains the first transport carrier (e.g., the first transport carrier 210a, 230a, and/or 250a), as described above.

Process 500 may include additional implementations, such as any single implementation or any combination of implementations described below and/or in connection with one or more other processes described elsewhere herein.

In a first implementation, process 500 includes loading, into the second buffer (e.g., the second buffer 212b, 232b, and/or 252b), the second transport carrier (e.g., the second transport carrier 210b, 230b, and/or 250b) from a storage area (e.g., the storage area 302) using at least one transfer device of the multiple-buffer OHT vehicle (e.g., the OHT vehicle 108, 200, 220, 240, and/or 308).

In a second implementation, alone or in combination with the first implementation, process 500 includes moving the at least one transfer device (e.g., the transfer device 226 and/or 314) from the second buffer (e.g., the second buffer 212b, 232b, and/or 252b) to the first buffer (e.g., the first buffer 212a, 232a, and/or 252a) after loading the second transport carrier (e.g., the second transport carrier 210b, 230b, and/or 250b).

In a third implementation, alone or in combination with one or more of the first and second implementations, the at least one transfer device includes a first transfer device (e.g., the first transfer device 208a and/or 248a) and a second transfer device (e.g., the second transfer device 208b and/or 248b), the first transport carrier (e.g., the first transport carrier 210a, 230a, and/or 250a) is loaded using the first transfer device, and the second transport carrier (e.g., the second transport carrier 210b, 230b, and/or 250b) is loaded using the second transfer device.

In a fourth implementation, alone or in combination with one or more of the first through third implementations, process 500 includes unloading the first transport carrier (e.g., the first transport carrier 210a, 230a, and/or 250a) from the first buffer (e.g., the first buffer 212a, 232a, and/or 252a), and loading a third transport carrier into the second buffer (e.g., the second buffer 212b, 232b, and/or 252b) while the multiple-buffer OHT vehicle (e.g., the OHT vehicle 108, 200, 220, 240, and/or 308) unloads the first transport carrier from the first buffer.

In a fifth implementation, alone or in combination with one or more of the first through fourth implementations, process 500 includes opening a first carriage mechanism (e.g., the first carriage mechanism 228a) while loading the first transport carrier (e.g., the first transport carrier 210a, 230a, and/or 250a), closing the first carriage mechanism after loading the first transport carrier such that the first carriage mechanism secures the first transport carrier, and opening a second carriage mechanism (e.g., the second carriage mechanism 228b) while unloading the second transport carrier (e.g., the second transport carrier 210b, 230b, and/or 250b).

In a sixth implementation, alone or in combination with one or more of the first through fifth implementations, loading the first transport carrier (e.g., the first transport carrier 210a, 230a, and/or 250a) comprises moving a transfer device (e.g., the transfer device 226 and/or 314) of the multiple-buffer OHT vehicle (e.g., the OHT vehicle 108, 200, 220, 240, and/or 308) to a central position in the multiple-buffer OHT vehicle, lifting the first transport carrier using the transfer device, and moving the transfer device, with the first transport carrier, to the first buffer (e.g., the first buffer 212a, 232a, and/or 252a).

In a seventh implementation, alone or in combination with one or more of the first through sixth implementations, unloading the second transport carrier (e.g., the second transport carrier 210b, 230b, and/or 250b) comprises lifting the second transport carrier from the second buffer (e.g., the second buffer 212b, 232b, and/or 252b) using a transfer device (e.g., the transfer device 226 and/or 314) of the multiple-buffer OHT vehicle (e.g., the OHT vehicle 108, 200, 220, 240, and/or 308), moving the transfer device, with the second transport carrier, to a central position in the multiple-buffer OHT vehicle, and lowering the second transport carrier using the transfer device.

In an eighth implementation, alone or in combination with one or more of the first through seventh implementations, unloading the second transport carrier (e.g., the OHT vehicle 108, 200, 220, 240, and/or 308) comprises unloading the second transport carrier from the second buffer (e.g., the second buffer 212b, 232b, and/or 252b) to a buffer station (e.g., the buffer station 314) associated with the load port (e.g., the load port 112 and/or 310) to permit the buffer station to move the second transport carrier into the load port.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
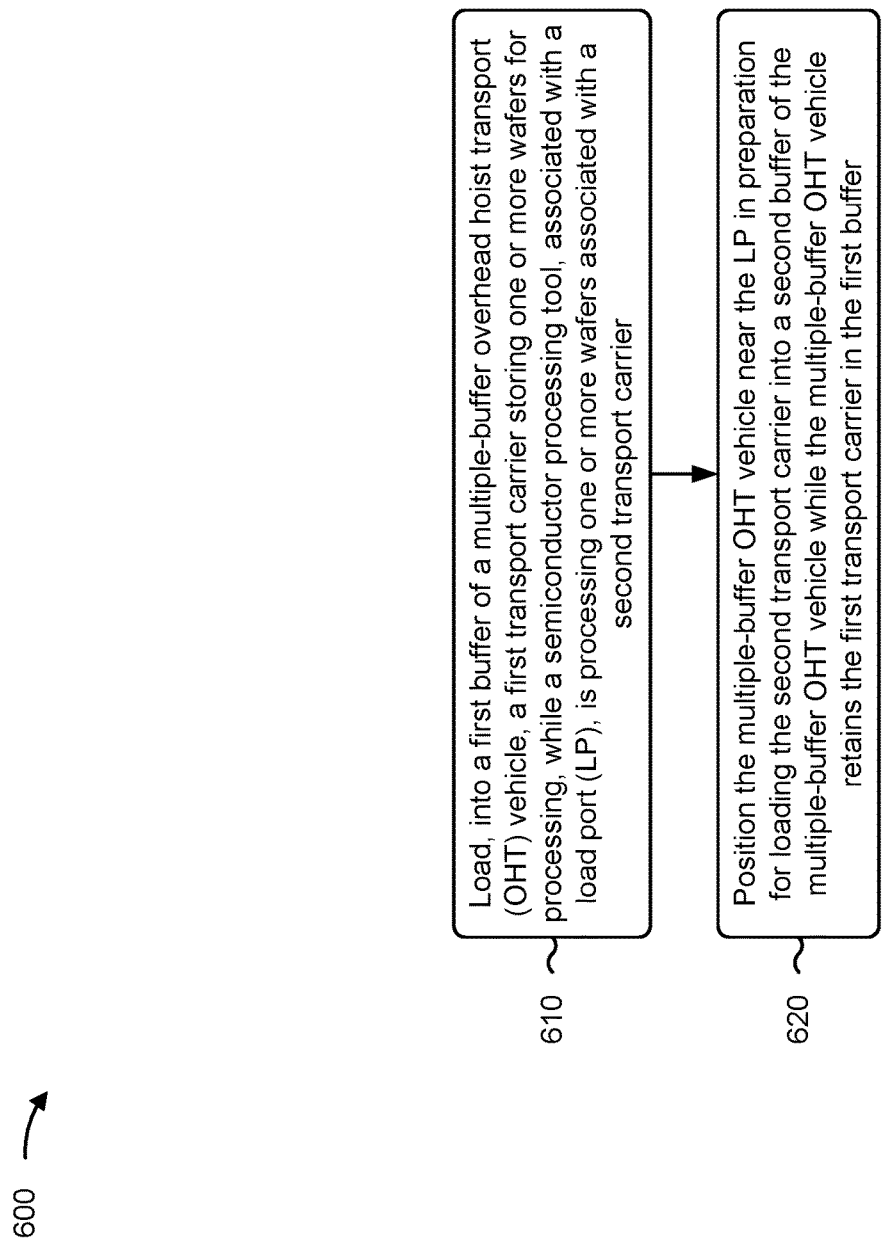

FIG. 6 is a flowchart of an example process 600 associated with a multiple-buffer OHT vehicle and method of using the same. In some implementations, one or more process blocks of FIG. 6 may be performed by an OHT vehicle (e.g., OHT vehicle 108, 200, 220, 240, and/or 308). In some implementations, one or more process blocks of FIG. 5 may be performed by another device or a group of devices separate from or including the OHT vehicle, such as a controller (e.g., controller 104), a load port (e.g., load port 112 or 310), and/or a semiconductor processing tool (e.g., semiconductor processing tool 116). Additionally, or alternatively, one or more process blocks of FIG. 5 may be performed by one or more components of device 400, such as processor 420, memory 430, storage component 440, input component 450, output component 460, and/or communication component 470.

As shown in FIG. 6, process 600 may include loading, into a first buffer of a multiple-buffer OHT vehicle, a first transport carrier storing one or more wafers for processing, where the first transport carrier is loaded into the first buffer while a semiconductor processing tool, associated with a load port, is processing one or more wafers associated with a second transport carrier (block 610). For example, the OHT vehicle (e.g., OHT vehicle 108, 200, 220, 240, and/or 308) may load, into the first buffer (e.g., the first buffer 212a, 232a, and/or 252a), the first transport carrier (e.g., the first transport carrier 210a, 230a, and/or 250a) storing one or more wafers for processing, as described above. In some implementations, the first transport carrier is loaded into the first buffer while the semiconductor processing tool (e.g., the semiconductor processing tool 116), associated with the load port (e.g., the load port 112 and/or 310), is processing one or more wafers associated with the second transport carrier (e.g., the second transport carrier 210b, 230b, and/or 250b).

As further shown in FIG. 6, process 600 may include positioning the multiple-buffer OHT vehicle above the load port in preparation for loading the second transport carrier into a second buffer of the multiple-buffer OHT vehicle while the multiple-buffer OHT vehicle retains the first transport carrier in the first buffer (block 620). For example, the OHT vehicle (e.g., OHT vehicle 108, 200, 220, 240, and/or 308) may position itself above the load port (e.g., the load port 112 and/or 310) in preparation for loading the second transport carrier (e.g., the second transport carrier 210b, 230b, and/or 250b) into the second buffer (e.g., the second buffer 212b, 232b, and/or 252b) while the OHT vehicle retains the first transport carrier (e.g., the first transport carrier 210a, 230a, and/or 250a) in the first buffer (e.g., the first buffer 212a, 232a, and/or 252a), as described above.

Process 600 may include additional implementations, such as any single implementation or any combination of implementations described below and/or in connection with one or more other processes described elsewhere herein.

In a first implementation, process 600 includes receiving, from a controller (e.g., the controller 104), a command that triggers loading of the first transport carrier (e.g., the first transport carrier 210a, 230a, and/or 250a), wherein the command is received while the semiconductor processing tool (e.g., the semiconductor processing tool 116) is processing the one or more wafers associated with the second transport carrier (e.g., the second transport carrier 210b, 230b, and/or 250b).

In a second implementation, alone or in combination with the first implementation, the command is received within a configured amount of time before an estimated completion time of processing the one or more wafers, associated with the second transport carrier (e.g., the second transport carrier 210b, 230b, and/or 250b), by the semiconductor processing tool (e.g., the semiconductor processing tool 116).

In a third implementation, alone or in combination with one or more of the first and second implementations, process 600 includes receiving, from a controller (e.g., the controller 104), a command that triggers positioning of the multiple-buffer OHT vehicle (e.g., OHT vehicle 108, 200, 220, 240, and/or 308) above the load port (e.g., the load port 112 and/or 310), wherein the command is received while the semiconductor processing tool (e.g., the semiconductor processing tool 116) is processing the one or more wafers associated with the second transport carrier (e.g., the second transport carrier 210b, 230b, and/or 250b).

In a fourth implementation, alone or in combination with one or more of the first through third implementations, process 600 includes receiving, from a controller (e.g., the controller 104), a first command that triggers loading of the second transport carrier (e.g., the second transport carrier 210b, 230b, and/or 250b) into the second buffer (e.g., the second buffer 212b, 232b, and/or 252b), and receiving, from the controller, a second command that triggers unloading of the first transport carrier (e.g., the first transport carrier 210a, 230a, and/or 250a) from the first buffer (e.g., the first buffer 212a, 232a, and/or 252a), wherein the second command is received before the second transport carrier is moved to another location.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a multiple-buffer OHT vehicle may be used to exchange transport carriers using a plurality of buffers to reduce the average time for removing a completed transport carrier from a semiconductor processing tool and providing a new transport carrier to the semiconductor processing tool. This conserves power and increases the efficiency with which microchips may be fabricated. Additionally, the AMHS is less likely to experience transfer delays during fabrication processes, which reduces the chance that wafers will be rendered unusable and thus wasted. In some implementations, the multiple-buffer OHT vehicle may pre-load a new transport carrier and transfer the new transport carrier above a load port of a semiconductor processing tool. Accordingly, an AMHS can further reduce the average time for removing a completed transport carrier and providing the new transport carrier. In some implementations, the AMHS may also use the plurality of buffers provided by the multiple-buffer OHT vehicle to increase storage capacity. For example, the AMHS may process about 10% larger volume of transport carriers by storing some transport carriers on the multiple-buffer OHT vehicle during fabrication processes.

As described in greater detail above, some implementations described herein provide a method. The method includes loading, from a load port and into a first buffer of a multiple-buffer overhead hoist transport (OHT) vehicle, a first transport carrier storing one or more processed wafers.

The method includes unloading, from a second buffer of the multiple-buffer OHT vehicle and to the load port, a second transport carrier storing one or more wafers for processing, while the first buffer retains the first transport carrier.

As described in greater detail above, some implementations described herein provide a method. The method includes loading, into a first buffer of a multiple-buffer overhead hoist transport (OHT) vehicle, a first transport carrier storing one or more wafers for processing, where the first transport carrier is loaded into the first buffer while a semiconductor processing tool, associated with a load port, is processing one or more wafers associated with a second transport carrier. The method includes positioning the multiple-buffer OHT vehicle above the load port in preparation for loading the second transport carrier into a second buffer of the multiple-buffer OHT vehicle while the multiple-buffer OHT vehicle retains the first transport carrier in the first buffer.

As described in greater detail above, some implementations described herein provide a system. The system includes a multiple-buffer overhead hoist transport (OHT) vehicle including a first buffer configured to hold a first transport carrier storing one or more wafers and a second buffer configured to hold a second transport carrier storing one or more wafers. The system includes at least one transfer device configured to selectively load or unload transport carriers into the first buffer and the second buffer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    loading, from a load port and into a first buffer of a multiple-buffer overhead hoist transport (OHT) vehicle, a first transport carrier storing one or more processed wafers; and
    unloading, from a second buffer of the multiple-buffer OHT vehicle and to the load port, a second transport carrier storing one or more wafers for processing, while the first buffer retains the first transport carrier.

2. The method of claim 1, further comprising:
    loading, into the second buffer, the second transport carrier from a storage area using at least one transfer device of the multiple-buffer OHT vehicle.

3. The method of claim 2, further comprising:
    moving the at least one transfer device from the second buffer to the first buffer after loading the second transport carrier.

4. The method of claim 2, wherein the at least one transfer device includes a first transfer device and a second transfer device, the first transport carrier is loaded using the first transfer device, and the second transport carrier is loaded using the second transfer device.

5. The method of claim 1, further comprising:
    unloading the first transport carrier from the first buffer; and
    loading a third transport carrier into the second buffer while the multiple-buffer OHT vehicle unloads the first transport carrier from the first buffer.

6. The method of claim 1, further comprising:
    opening a first carriage mechanism while loading the first transport carrier;
    closing the first carriage mechanism after loading the first transport carrier such that the first carriage mechanism secures the first transport carrier; and
    opening a second carriage mechanism while unloading the second transport carrier.

7. The method of claim 1, wherein loading the first transport carrier comprises:
    moving a transfer device of the multiple-buffer OHT vehicle to a central position in the multiple-buffer OHT vehicle;
    lifting the first transport carrier using the transfer device; and
    moving the transfer device, with the first transport carrier, to the first buffer.

8. The method of claim 1, wherein unloading the second transport carrier comprises:
    lifting the second transport carrier from the second buffer using a transfer device of the multiple-buffer OHT vehicle;
    moving the transfer device, with the second transport carrier, to a central position in the multiple-buffer OHT vehicle; and
    lowering the second transport carrier using the transfer device.

9. The method of claim 1, wherein unloading the second transport carrier comprises:
    unloading the second transport carrier from the second buffer to a buffer station associated with the load port to permit the buffer station to move the second transport carrier into the load port.

10. A method, comprising:
    loading, into a first buffer of a multiple-buffer overhead hoist transport (OHT) vehicle, a first transport carrier storing one or more wafers for processing,
        wherein the first transport carrier is loaded into the first buffer while a semiconductor processing tool, associated with a load port, is processing one or more wafers associated with a second transport carrier;
    positioning the multiple-buffer OHT vehicle above the load port in preparation for loading the second transport carrier into a second buffer of the multiple-buffer OHT vehicle while the multiple-buffer OHT vehicle retains the first transport carrier in the first buffer; and
    receiving, from a controller, at least one of:
        a first command that triggers positioning of the multiple-buffer OHT vehicle above the load port, wherein the first command is received while the semiconductor processing tool is processing the one or more wafers associated with the second transport carrier or
        a second command, that triggers loading of the second transport carrier into the second buffer, within a configured amount of time before an estimated completion time of processing the one or more wafers, associated with the second transport carrier, by the semiconductor processing tool.

11. The method of claim 10, wherein the second command is received while the semiconductor processing tool is processing the one or more wafers associated with the second transport carrier.

12. The method of claim 10, wherein the second command is received within the configured amount of time before the estimated completion time of processing the one or more wafers, associated with the second transport carrier, by the semiconductor processing tool.

13. The method of claim 10, wherein the first command is received while the semiconductor processing tool is processing the one or more wafers associated with the second transport carrier.

14. The method of claim 10, further comprising:
receiving, from the controller, the second command that triggers loading of the second transport carrier into the second buffer; and
receiving, from the controller, a third command that triggers unloading of the first transport carrier from the first buffer,
wherein the third command is received before the second transport carrier is moved to another location.

15. A system, comprising:
a multiple-buffer overhead hoist transport (OHT) vehicle including a first buffer configured to hold a first transport carrier storing one or more wafers and a second buffer configured to hold a second transport carrier storing one or more wafers;
at least one transfer device configured to selectively load or unload transport carriers into the first buffer and the second buffer; and
a connection element joining a first inner volume of the multiple-buffer OHT vehicle to a second inner volume of the multiple-buffer OHT vehicle,
wherein:
the at least one transfer device includes a first transfer device configured to selectively load or unload transport carriers into the first buffer and a second transfer device configured to selectively load or unload transport carriers into the second buffer, or
at least one of the first inner volume includes the first buffer, or the second inner volume includes the second buffer.

16. The system of claim 15, further comprising:
a first carriage mechanism configured to support the first transport carrier when held in the first buffer; and
a second carriage mechanism configured to support the second transport carrier when held in the second buffer.

17. The system of claim 15, wherein the at least one transfer device includes a single transfer device configured to move between the first buffer and the second buffer.

18. The system of claim 15, wherein the at least one transfer device includes the first transfer device and the second transfer device.

19. The system of claim 15, wherein the first inner volume includes the first buffer, and the second inner volume includes the second buffer.

20. The system of claim 19, wherein at least one sensor of the multiple-buffer OHT vehicle between the first inner volume and the second inner volume is disabled during operation of the multiple-buffer OHT vehicle.

* * * * *